(12) United States Patent
Kouno et al.

(10) Patent No.: US 8,405,122 B2
(45) Date of Patent: Mar. 26, 2013

(54) INSULATED GATE SEMICONDUCTOR DEVICE

(75) Inventors: Kenji Kouno, Gifu (JP); Yukio Tsuzuki, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 64 days.

(21) Appl. No.: 13/010,307

(22) Filed: Jan. 20, 2011

(65) Prior Publication Data
US 2011/0193132 A1    Aug. 11, 2011

(30) Foreign Application Priority Data

Feb. 5, 2010   (JP) ................................ 2010-024029
Aug. 31, 2010  (JP) ................................ 2010-193473

(51) Int. Cl.
*H01L 29/66* (2006.01)
(52) U.S. Cl. ................. 257/139; 257/197; 257/E29.197
(58) Field of Classification Search .................. 257/139, 257/197, E29.197
See application file for complete search history.

(56) References Cited

U.S. PATENT DOCUMENTS

| 5,489,787 A | 2/1996 | Amaratunga et al. |
| 6,040,599 A | 3/2000 | Takahashi |
| 2004/0094798 A1 | 5/2004 | Hara et al. |
| 2009/0008674 A1* | 1/2009 | Udrea .......................... 257/138 |
| 2009/0189181 A1 | 7/2009 | Koyama et al. |
| 2009/0283797 A1 | 11/2009 | Takahashi et al. |
| 2009/0315070 A1* | 12/2009 | Yoshikawa .................... 257/139 |

FOREIGN PATENT DOCUMENTS

| JP | 2007013224 A | 1/2007 |
| JP | 2007258363 A | 10/2007 |
| JP | 2007266134 A | 10/2007 |
| JP | 4366938 B2 | 9/2009 |

* cited by examiner

*Primary Examiner* — Kimberly Rizkallah
*Assistant Examiner* — Timor Karimy
(74) *Attorney, Agent, or Firm* — Posz Law Group, PLC

(57) ABSTRACT

An insulated gate semiconductor device includes a semiconductor substrate, channel regions, floating regions, an emitter region, a body region, a hole stopper layer, and an emitter electrode. The channel regions and the floating regions are repeatedly arranged such that at least one floating region is located between adjacent channel regions. The emitter region and the body region are located in a surface portion of each channel region. The body region is deeper than the emitter region. The hole stopper layer is located in each floating region to divide the floating region into a first region and a second region. The emitter electrode is electrically connected to the emitter region and the first region.

17 Claims, 27 Drawing Sheets

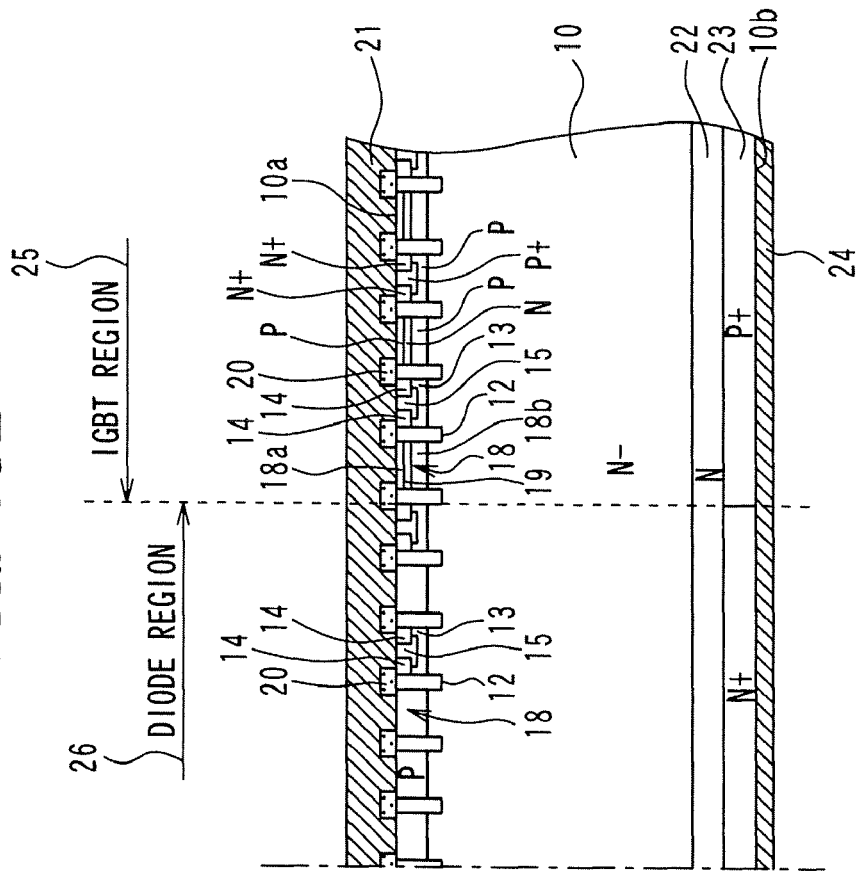
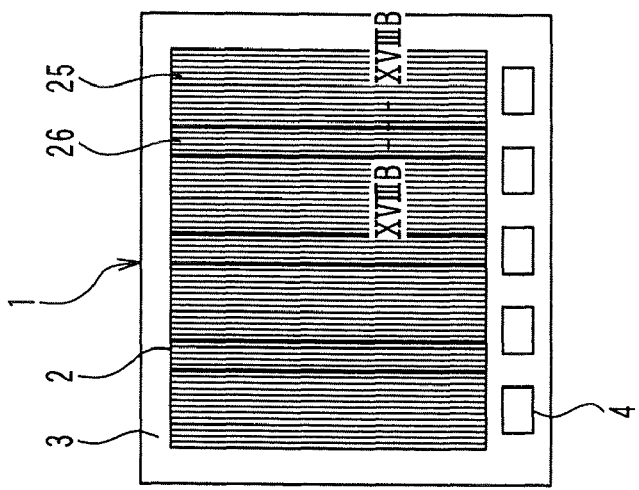

INSULATED GATE SEMICONDUCTOR DEVICE

CROSS REFERENCE TO RELATED APPLICATION

This application is based on and claims priority to Japanese Patent Application No. 2010-24029 filed on Feb. 5, 2010 and No. 2010-193473 filed on Aug. 31, 2010, the disclosures of which are incorporated herein by reference.

FIELD OF THE INVENTION

The present invention relates to an insulated gate semiconductor device.

BACKGROUND OF THE INVENTION

An insulated gate semiconductor device (i.e., IGBT) as a switching device for an inverter has been disclosed in, for example, JP 2007-13224A, US 2004/0094798 corresponding to JP 2004-95954A, U.S. Pat. No. 5,489,787 corresponding to JP 7-58332A, JP 2007-266134A, and JP 4366938.

Specifically, in JP 2007-13224A, trenches are formed in a high resistance N-type base layer at intervals to separate a main cell and a dummy cell form each other. The trench has a trench-gate structure. In the main cell, a P-type base layer is formed on the N-type base layer, and an N-type emitter layer is formed on the P-type base layer. Further, in the dummy cell, a P-type buffer layer is formed on the N-type base layer. The P-type base layer and the N-type emitter layer in the main cell are in contact with each other through an emitter electrode. A buffer electrode is formed on the P-type buffer layer in the dummy cell.

The buffer electrode is electrically connected to the emitter electrode through a buffer resistor. Thus, the P-type buffer layer in the dummy cell is emitter-grounded through the buffer resistor so that low switching loss can be achieved.

In US 2004/0094798, an $N^-$-type epitaxial region is formed on an $N^+$-type substrate, and a P-type base region is formed on the $N^-$-type epitaxial region. A trench extending from a surface of the P-type base region to the $N^-$-type epitaxial region is formed. A buried gate including a gate oxide layer and a gate electrode is formed in the trench. An interlayer dielectric layer is formed on the buried gate, and an N-type source region is formed around the trench.

Between the $N^-$-type epitaxial region and the P-type base region, a thin P-type region and a thin N-type region are inserted on the bottom side of the trench over a cell region. Thus, depletion is substantially caused by PN junction between the P-type region and the N-type region. Accordingly, a parasitic capacitance is reduced so that low-on voltage can be achieved.

In U.S. Pat. No. 5,489,787, a P-type base layer is formed on an $N^-$-type layer, and a trench extending form the P-type base layer to the $N^-$-type layer is formed. A trench gate structure is formed in the trench. Further, an $N^+$-type emitter region is formed around the trench gate structure on the surface side of the P-type base layer.

An N-type layer for storing carries between the $N^-$-type layer and the P-type base layer is formed over a cell region. Since the N-type layer causes the carrier distribution in the $N^-$-type layer to be close to the carrier distribution in a diode, low-on voltage can be achieved.

In JP 2007-266134A, two types of regions are formed on a surface of a semiconductor substrate. Specifically, in a first type region, a P-type first body region, an $N^+$-type emitter region, and a $P^+$-type first body region are formed. In a second type region, a P-type second body region, a $P^+$-type second body region, and an $N^+$-type accumulation region are formed. An $N^+$-type emitter region is not formed in the second type region, and a $P^+$-type second body contact region is formed to a surface portion of the second type region.

The accumulation region divides the second type region in two parts in its thickness direction. Further, the accumulation region extends to a position deeper than a bottom of the first body contact region of the first type region. Thus, since a parasitic transistor is not formed in the second type region where the accumulation region is formed, it is less likely that latch-up phenomenon occurs.

A structure disclosed in JP 4366938 is similar to the structure disclosed in JP 2007-266134A. In JP 4366938, trenches are formed in an $N^-$-type drift layer to form semiconductor regions between the trenches. A gate insulating layer and a gate electrode are buried in the trench. The semiconductor regions include a first semiconductor region and a second semiconductor region. In the first semiconductor region, an $N^+$-type emitter region is formed. In the second semiconductor region, an $N^+$-type emitter region is not formed. The first region and the second region are alternately arranged. A $P^+$-type emitter region deeper than the $N^+$-type emitter region is formed in the first semiconductor region.

A $P^+$-type emitter region is formed over a surface portion of the second semiconductor region, and an $N^+$-type hole barrier region is formed below the $P^+$-type emitter region. The $N^+$-type hole barrier region is deeper than the $P^+$-type emitter region of the first semiconductor region and is not in contact with the gate insulating layer. Thus, a path for holes flowing between the gate insulating layer and the $N^+$-type hole barrier region is narrowed so that a reduction in holes in the drift region can be reduced. Accordingly, on-voltage of an IGBT can be reduced.

The above conventional devices have the following disadvantages.

Although JP 2007-13224A discloses a circuit diagram in which the buffer resistor is connected to the buffer electrode, it is practically difficult to uniformly arrange the buffer resistor over a semiconductor device having a trench gate structure as shown in the circuit diagram. This is because an actual buffer resistance can vary depending on location due to a wiring resistance.

In US 2004/0094798, the N-type region is located on the bottom side of the trench. In this case, if the N-type region is formed by thermal diffusion, the P-type base region as a channel needs to cancel the N-type region. Therefore, a threshold voltage (Vth) of the gate can have variations, and it is difficult to achieve high resistance to voltage breakdown. Further, if the N-type region is formed by ion implantation, a special apparatus for achieving high acceleration voltage is required to form the N-type region deep.

In U.S. Pat. No. 5,489,787, the N-type layer is formed on the P-type base layer and located near the $N^+$-type emitter region. Therefore, a threshold voltage (Vth) of the gate can have variations, and resistance to voltage breakdown may be degraded due to thyristor action.

In JP 2007-266134A, the accumulation region formed in the second type region, where the $N^+$-type emitter region is not formed, is deeper than the $P^+$-type first body contact region.

In JP 4366938, the hole barrier region formed in the second semiconductor region, where the $N^+$-type emitter region is not formed, is deeper than the $P^+$-type emitter region.

A special equipment is required to form the hole accumulation region or the hole barrier region deeper than the first body contact region or the P+-emitter region. Further, it is difficult to accurately form the hole accumulation region or the hole barrier region at such a deep portion by ion implantation. FIG. 5A, which will be described later, shows a relationship between a projection range and an acceleration energy of ion implantation. FIG. 5B, which will be described later, shows a relationship between a projection range variation (dispersion) and the acceleration energy of ion implantation. As can be seen from FIGS. 5A and 5B, the projection range can be increased by increasing the acceleration energy. However, the increase in the acceleration energy results in an increase in the projection range variation. For example, although phosphorus (P) can be ion-implanted to a depth of 1.2 μm with an acceleration energy of 1000 keV, the projection range variation (one side) becomes about 0.2 μm, i.e., spreading in the depth direction becomes about 0.4 μm.

In the case of a reverse conducting IGBT (RC-IGBT), when a P+-type body region is formed, recover loss is increased due to an increase in the amount of holes injected during diode action. Specifically, to prevent undesirable parasitic transistor action from the point of view of resistance to surge, the P+-type body region has a high impurity concentration and is diffused deep so that P+-type body region can be located below an N-type emitter. Since the efficiency of hole injection in such a deep P+-type diffusion layer with a high impurity concentration is very high, the recover loss is increased.

As described above, the conventional devices have a difficulty in achieving both a low on-voltage and a low switching-loss.

SUMMARY OF THE INVENTION

In view of the above, it is an object of the present invention to provide an insulated gate semiconductor device having a low on-voltage and a low switching-loss.

According to an aspect of the present invention, an insulated gate semiconductor device having an IGBT element includes a first conductivity type semiconductor substrate, second conductivity type channel regions, second conductivity type floating regions, a first conductivity type emitter region, a second conductivity type body region, a first conductivity type hole stopper layer, and an emitter electrode. The semiconductor substrate has a surface. The channel regions are located on the surface side of the semiconductor substrate. The floating regions are located on the surface side of the semiconductor substrate. The emitter region is located in a surface portion of each channel region. The body region is located in the surface portion of each channel region. The body region is deeper than the emitter region. The hole stopper layer is located in each floating region to divide the floating region into a first region and a second region in a depth direction of the floating region. The first region is located on the surface side of the semiconductor substrate. The second region is located on a bottom side of the floating region. The emitter electrode is located on the surface of the semiconductor substrate and electrically connected to each of the emitter region and the first region of the floating region. The channel regions and the floating regions are repeatedly arranged in a predetermined pattern in a direction parallel to the first surface of the semiconductor substrate in such a manner that at least one floating region is located between adjacent channel regions.

BRIEF DESCRIPTION OF THE DRAWINGS

The above and other objectives, features and advantages of the present invention will become more apparent from the following detailed description made with check to the accompanying drawings. In the drawings:

FIG. 18A is a diagram illustrating a plan view of a semiconductor chip according to a seventh embodiment of the present invention, and FIG. 18B is a diagram illustrating a cross-sectional view taken along the line XVIIIB-XVIIIB in FIG. 18A;

DETAILED DESCRIPTION OF THE PREFERRED EMBODIMENTS

Figure 1:
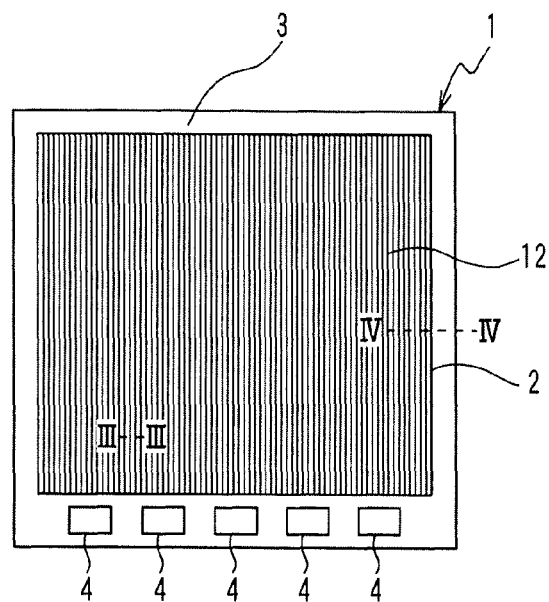
FIG. 1 is a diagram illustrating a plan view of a semiconductor chip according to a first embodiment of the present invention.

Embodiments of the present invention are described below with reference to the drawings. Throughout the embodiments, the same symbols are given to the same or corresponding parts in the drawings. N-type, $N^+$-type, and $N^-$-type correspond to a first conductivity type, and P-type and $P^+$-type correspond to a second conductivity type.

(First Embodiment)

An insulated gate semiconductor device according to a first embodiment of the present invention is described below with reference to FIGS. 1-4. For example, the insulated gate semiconductor device can be used as a power switching element in a power supply circuit such as an inverter or a DC/DC converter.

Figure 2:
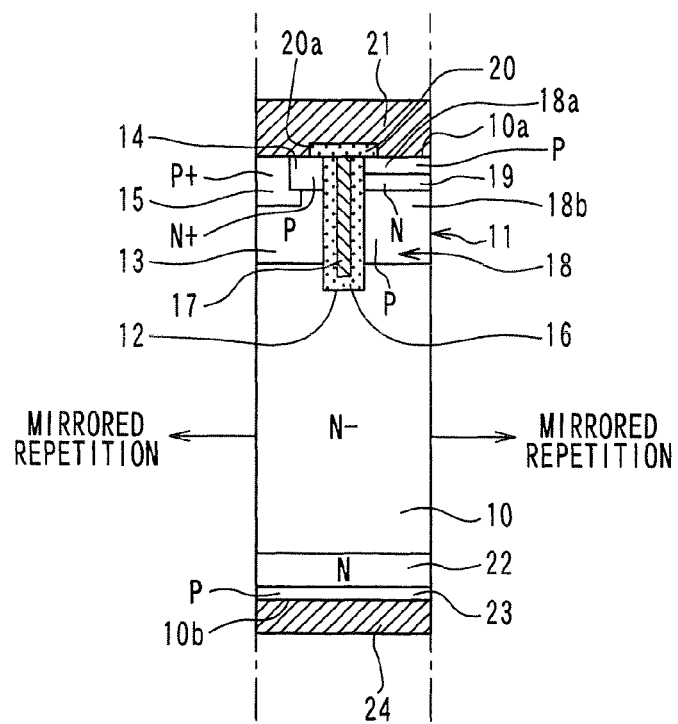
FIG. 2 is a diagram illustrating a partial cross-sectional view taken along the line III-III in FIG. 1.

FIG. 1 is a diagram illustrating a plan view of a semiconductor chip 1 as the insulated gate semiconductor device. FIG. 2 is a diagram illustrating a partial cross-sectional view taken along the line III-III in FIG. 1.

As shown in FIG. 1, the semiconductor chip 1 includes a cell area 2, a guard ring region 3 located around the cell area 2, and pads 4.

The cell area 2 is an area where an insulated gate bipolar transistor (IGBT) element is formed. As shown in FIG. 2, the IGBT element is formed in an $N^-$-type semiconductor substrate 10 that serves as a drift layer. The semiconductor substrate 10 has a front surface 10a and a back surface 10b opposite to the front surface 10a. A P-type base layer 11 having a predetermined thickness is formed on the front surface 10a side of the semiconductor substrate 10. Trenches 12 are formed on the front surface 10a side of the semiconductor substrate 10 and reach the $N^-$-type region of the semiconductor substrate 10 by penetrating the base layer 11. Thus, the base layer 11 is divided into multiple parts by the trenches 12.

A longitudinal direction of each trench 12 is parallel to the front surface 10a of the semiconductor substrate 10, and the trenches 12 extend parallel to each other in the longitudinal direction. For example, the trenches 12 can be arranged at regular intervals, and end portions of adjacent trenches 12 can be joined together to form a ring-shaped trench 12.

The base layer 11 located between adjacent ring-shaped trenches 12 (i.e., the base layer 11 that is not enclosed in each ring-shaped trench 12) provides a P-type channel layer 13 that serves as a channel region. An $N^+$-type emitter region 14 is formed in a surface portion of the channel layer 13. A $P^+$-type body region 15 is formed in the surface portion of the channel layer 13 between adjacent emitter regions 14. A depth of the body region 15 from the front surface 10a of the semiconductor substrate 10 is greater than a depth of the emitter region 14 from the front surface 10a of the semiconductor substrate 10.

An impurity concentration of the $N^+$-type emitter region 14 is greater than an impurity concentration of the $N^-$-type semiconductor substrate 10. The emitter region 14 is terminated inside the base layer 11 and in contact with a side wall of the trench 12. An impurity concentration of the $P^+$-type body region 15 is greater than an impurity concentration of the P-type channel layer 13. Like the emitter region 14, the body region 15 is terminated inside the base layer 11.

Specifically, the emitter region 14 has a rodlike shape and extends along the longitudinal direction of the trench 12 between adjacent trenches 12. The emitter region 14 is in contact with the side wall of the trench 12 and terminated before the end portion of the trench 12. The body region 15 has a rodlike shape and extends along the longitudinal direction of the trench 12 (i.e., longitudinal direction of the emitter region 14) between adjacent emitter regions 14.

An inner surface of each trench 12 is covered with a gate insulating layer 16. A gate electrode 17 is formed on the gate insulating layer 16. For example, the gate electrode 17 can be made of polysilicon. The gate electrode 17 extends along the longitudinal direction of the trench 12 and is connected to a corresponding pad 4 shown in FIG. 1. In this way, the trench 12 is filled with the gate insulating layer 16 and the gate electrode 17 so that a trench gate structure can be formed.

The base layer 11 enclosed in each ring-shaped trench 12 (i.e., the base layer 11 except the channel layer 13) provides a floating layer 18.

In summary, the base layer 11 is divided by the trenches 12 into the channel layer 13, where the emitter region 14 is formed, and the floating layer 18, where the emitter region 14 is not formed. The emitter region 14 is alternately formed in the divided base layer 11 so that the channel layer 13 and the floating layer 18 can be repeatedly arranged in a predetermined pattern. Thus, in the cell area 2, the IGBT element (IGBT cell) and a dummy element (dummy cell) are alternately arranged so that adjacent IGBT elements can be spaced from each other. For example, adjacent IGBT elements can be spaced from each other one dummy element. Therefore, the insulated gate semiconductor device according to the first embodiment is sometimes hereinafter called the "spaced-type IGBT element".

The floating layer 18 of the base layer 11 is divided by an N-type hole stopper layer 19 into a first layer 18a and a second layer 18b in a depth direction of the trench 12. The first layer 18a is located closer to an opening of the trench 12 than the second layer 18b. In other words, the second layer 18b is located closer to a bottom of the trench 12 than the first layer 18a. The first layer 18a and the second layer 18b are completely, electrically isolated from each other by the hole stopper layer 19.

The hole stopper layer 19 is formed only in the floating layer 18 of the base layer 11. In other words, the hole stopper layer 19 is not formed in the channel layer 13 of the base layer 11. That is, the hole stopper layer 19 does not exist in the IGBT cell, but exists in the dummy cell, where the channel region is not formed.

The hole stopper layer 19 is located in a surface portion of the floating layer 18 (i.e., located on the front surface 10a side of the semiconductor substrate 10) in the thickness direction of the trench 12. Specifically, the hole stopper layer 19 is located at a depth shallower than a bottom of the body region 15 of the channel layer 13. It is preferable that the depth of the hole stopper layer 19 from the surface of the floating layer 18 be less than half of a depth of the trench 12. For example, the depth of the hole stopper layer 19 from the surface of the floating layer 18 can be about one-fifth of the depth of the trench 12. For example, assuming that the depth of the trench 12 is about 5 micrometers (μm), the hole stopper layer 19 having a thickness of about 0.2 μm can be located at a depth of about 0.5 μm from the surface of the floating layer 18. For example, the hole stopper layer 19 can have an impurity concentration of about $1\times10^{16}/cm^3$ to about $1\times10^{17}/cm^3$.

An interlayer dielectric layer 20 such as a borophosphosilicate glass (BPSG) layer is formed on the base layer 11. A contact hole 20a is formed in the interlayer dielectric layer 20. A part of the emitter region 14, the body region 15, and a part of the first layer 18a of the floating layer 18 are exposed outside the interlayer dielectric layer 20 through the contact hole 20a. An emitter electrode 21 is formed on the interlayer dielectric layer 20 and electrically connected through the contact hole 20a to the emitter region 14, the body region 15, and the first layer 18a. Thus, the emitter electrode 21 is electrically connected to each of the emitter region 14 and the first layer 18a.

An N-type field stop layer 22 is formed on the back surface 10b side of the semiconductor substrate 10. A P-type collector layer 23 is formed on the field stop layer 22. A collector electrode 24 is formed on the collector layer 23.

Figure 3:
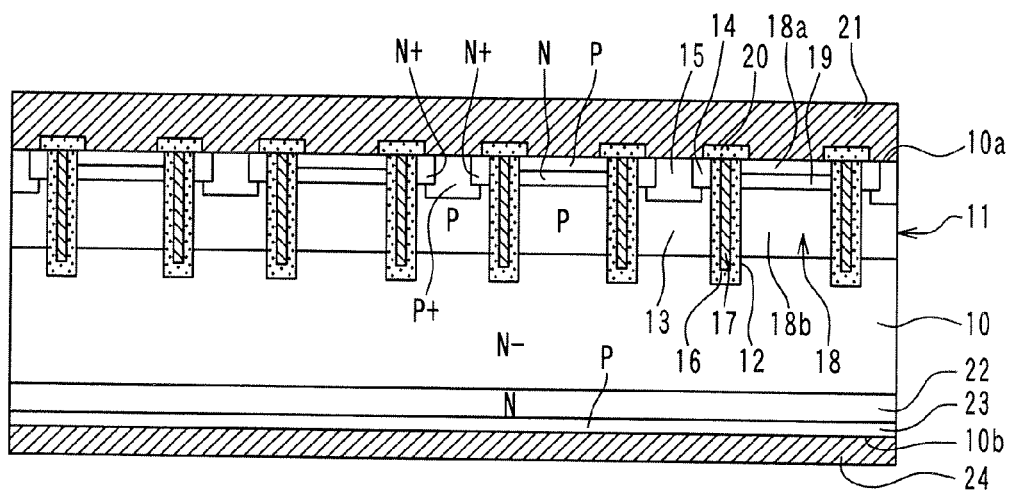
FIG. 3 is a diagram illustrating a cross-sectional view taken along the line III-III in FIG. 1.

FIG. 2 shows a minimum unit structure of the IGBT cell and the dummy cell in the cell area 2. The unit structure shown in FIG. 2 is repeatedly arranged in a mirrored manner so that a structure shown in FIG. 3 can be formed. FIG. 3 is a diagram illustrating the cross-sectional view taken along the line III-III in FIG. 1. As shown in FIG. 3, the base layer 11 between adjacent trenches 12 alternately provides the channel layer 13 and the floating layer 18. Each floating layer 18 is provided with the hole stopper layer 18. It is noted that the structure shown in FIG. 3 is repeatedly arranged in a mirrored manner over the cell area 2.

Figure 4:
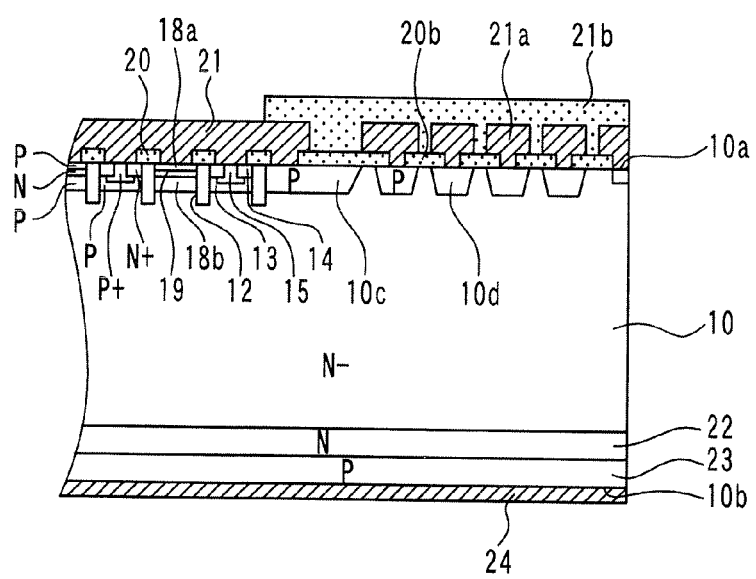
FIG. 4 is a diagram illustrating a cross-sectional view taken along the line IV-IV in FIG. 1.

FIG. 4 is a diagram illustrating a cross-sectional view taken along the line IV-IV in FIG. 1. For sake of simplicity, the gate insulating layer 16 and the gate electrode 17 in the trench 12 are omitted in FIG. 4. For example, as shown in FIG. 4, the guard ring region 3 located around the cell area 2 can include a ring-shaped P-type well region 10c and ring-shaped P-type guard rings 10d. The well region 10c and the guard ring 10d are formed in the surface portion of the semiconductor substrate 10 to surround the cell region 2.

An oxide layer 20b is formed on the guard ring 10d. A hole is formed in the oxide layer 20b at a position corresponding to the guard ring 10d. A peripheral electrode 21a is formed on the oxide layer 20b and electrically connected to the guard ring 10d through the hole of the oxide layer 20b. The peripheral electrode 21a is covered with a passivation layer 21b.

The pads 4 shown in FIG. 1 are used to electrically connect the IGBT element to external circuitry. The pads 4 include a pad connected to the gate electrode 17 through a wiring member that is arranged in the semiconductor chip 1. Further, the pads 4 can include a pad used to detect a temperature of the semiconductor chip 1.

Next, a method of manufacturing the above-described insulated gate semiconductor device is described. Firstly, an N⁻-type wafer 1 is prepared, and a P-type base layer 11 is formed on a surface of the wafer by thermal diffusion. Then, trenches 12 are formed in such a manner that the trenches 12 can reach the wafer by penetrating the base layer 11. Then, a gate insulating layer 16 and a gate electrode 17 are formed in each trench 12.

Then, a first mask having an opening corresponding to an N⁺-type emitter region 14 is placed on the wafer. Then, ion implantation of N-type impurities is performed by using the first mask. Then, a second mask having an opening corresponding to a P⁺-type body region 15 is placed on the wafer after removing the first mask. Then, ion implantation of P-type impurities is performed by using the second mask. Then, heat treatment (i.e., annealing) is performed to activate the implanted impurities after removing the second mask. In this way, the N⁺-type emitter region 14 and the P⁺-type body region 15 are formed.

Then, ion implantation using a mask and heat treatment subsequent to the ion implantation are performed to form a hole stopper layer 19 in a floating layer 18 of the base layer 11. For example, ion implantation of dopants such as phosphorus (P) can be performed with a concentration of about from $1\times10^{12}/cm^2$ to about $1\times10^{14}/cm^2$, and then heat treatment for activating the implanted dopants can be performed at a temperature of 900° C. or more. Alternatively, after ion implantation of phosphorus and heat treatment for activating the implanted phosphorus are performed, ion implantation of boron (B) and heat treatment for activating the implanted boron can be performed. In this way, the hole stopper layer 19 is formed in the floating layer 18.

Figure 5A:
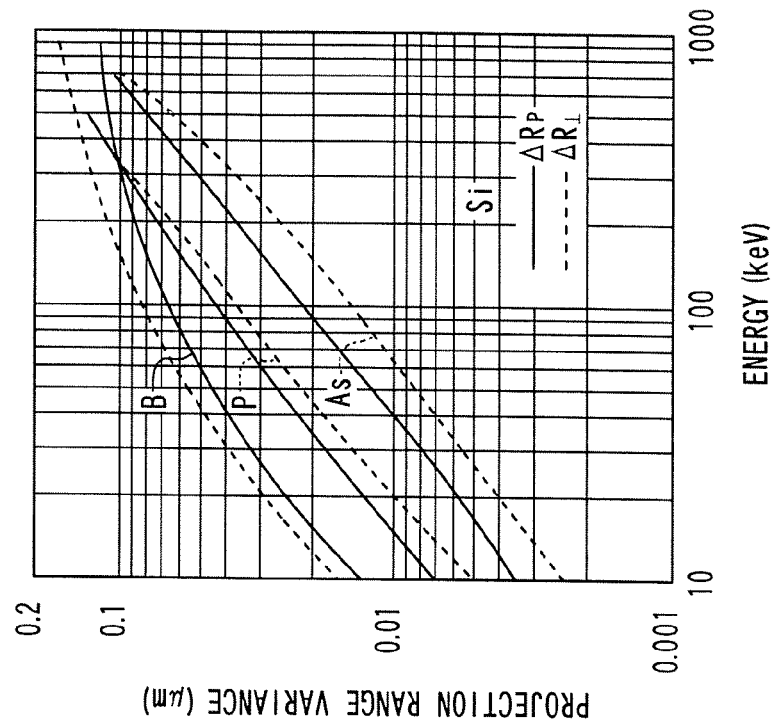
FIG. 5A is a diagram illustrating a relationship between a projection range and an acceleration energy of ion implantation.
Figure 5B:
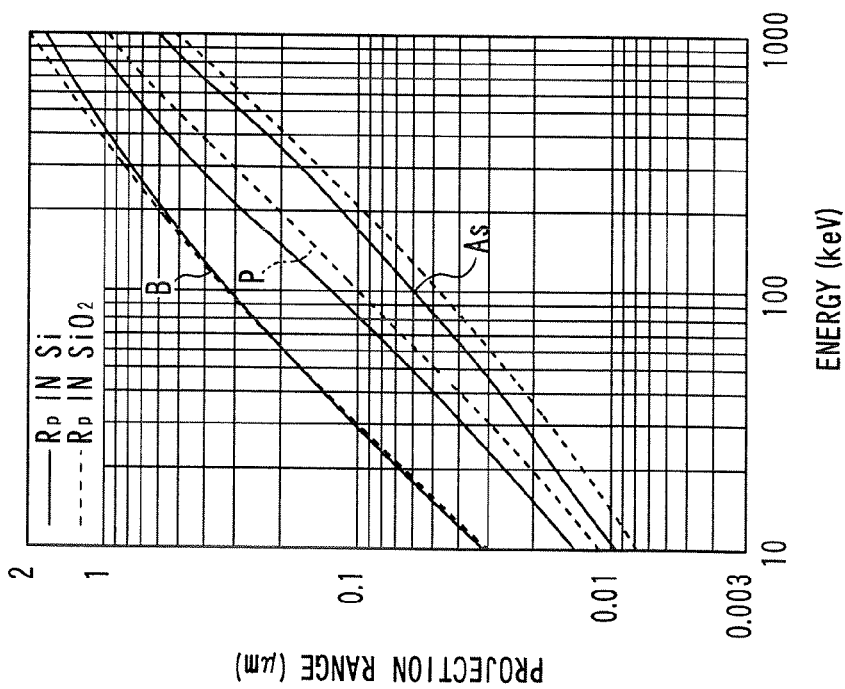
FIG. 5B is a diagram illustrating a relationship between a projection range variation and the acceleration energy.

FIG. 5A is a diagram illustrating a relationship between a projection range (i.e., peak depth) and an acceleration energy of ion implantation, and FIG. 5B is a diagram illustrating a relationship between a projection range variation and the acceleration energy. As can be seen from FIGS. 5A and 5B, when boron (B) or phosphorus (P) is used as an impurity, the projection range increases in proportion to the acceleration energy. For example, when phosphorus (P) is ion-implanted into the semiconductor substrate 10 with an energy of 600 keV, the hole stopper layer 19 can be formed at a depth of about 0.8 μm from the front surface 10a of the semiconductor substrate 10. The relationships shown in FIGS. 5A and 5B are based on pages 430-431 of "Physics Of Semiconductor Devices", 1st Edition by S M Sze.

Then, an interlayer dielectric layer 20 is formed on the base layer 11. Then, a contact hole 20a is formed in the interlayer dielectric layer 20 so that a part of the emitter region 14, the body region 15, and a part of the first layer 18a of the floating layer 18 can be exposed outside the interlayer dielectric layer 20 through the contact hole 20a. An emitter electrode 21 is formed on the interlayer dielectric layer 20 and electrically connected through the contact hole 20a to the emitter region 14, the body region 15, and the first layer 18a. Thus, the emitter electrode 21 is electrically connected to each of the emitter region 14 and the first layer 18a of the floating layer 18. It is noted that the pads 4 can be formed in the same process as the emitter electrode 21.

Then, an N-type field stop layer 22 is formed on a back side of the wafer, and a P-type collector layer 23 is formed on the field stop layer 22. Then, a collector electrode 24 is formed on the collector layer 23. Then, dicing is performed to cut the wafer into individual semiconductor chips 1. In this way, the semiconductor chip 1 can be manufactured. It is noted that the guard ring portion 3 can be formed in the same process as described above or in a different process.

The present inventors have conducted a simulation to evaluate characteristics of a structure in which the hole stopper layer 19 is formed in a shallow region of the floating layer 18. FIGS. 6-11 show a result of the simulation.

Figure 6:
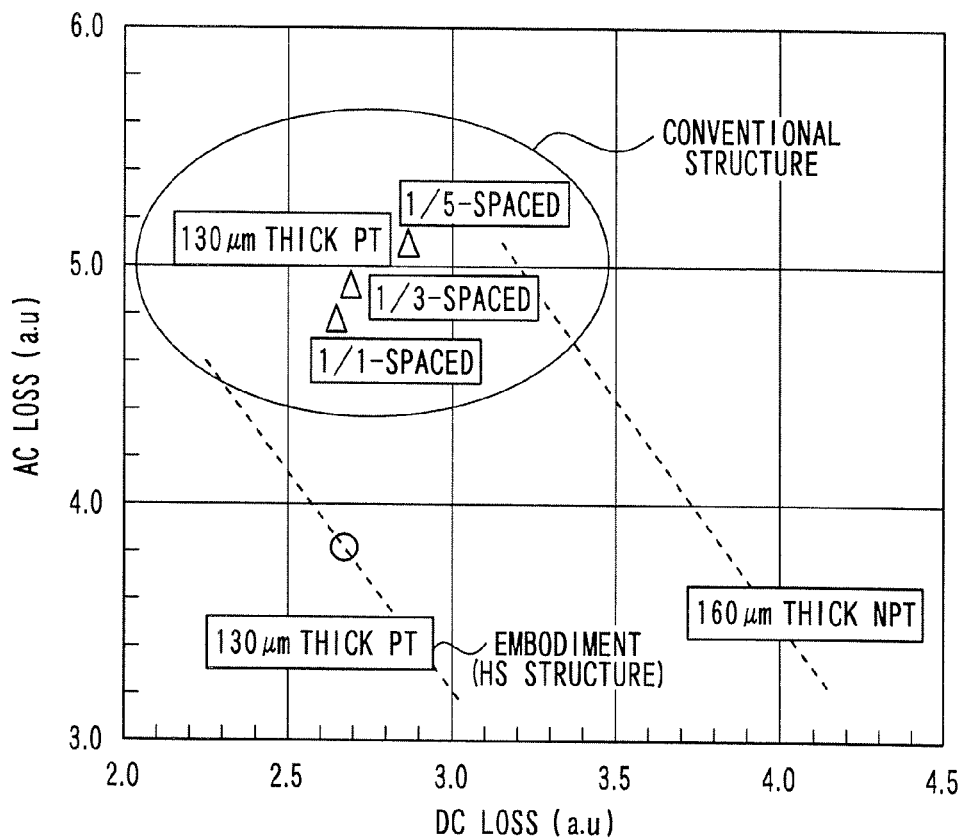
FIG. 6 is a diagram illustrating loss characteristics of an IGBT element.

FIG. 6 is a graph illustrating loss characteristics of an IGBT element. The horizontal axis of the graph represents DC loss of the IGBT element, and the vertical axis of the graph represents AC loss of the IGBT element. The ideal characteristics of the IGBT element are that both the DC loss and the AC loss are small.

In FIG. 6, "conventional structure" means a structure in which a hole stopper layer 19 is not formed. "1/5-spaced" means that adjacent IGBT elements are spaced from each other by five dummy cells. "1/3-spaced" means that adjacent IGBT elements are spaced from each other by three dummy cells. "1/1-spaced" means that adjacent IGBT elements are spaced from each other by one dummy cell. "PT" means a punch through structure. "NPT" means a non-punch through structure. "130 μm thick" and "160 μm thick" mean a thickness of the IGBT element.

As can be seen from FIG. 6, in the conventional structure, the AC loss is large. Further, when the thickness of the IGBT element is 160 μm, the DC loss is large. Both the DC loss and the AC loss of a HS structure according to the first embodiment, in which the hole stopper layer 19 is formed in the floating layer 18, are less than those of the conventional structure. As compared to the conventional structure, the HS structure according to the first embodiment has almost the same on-voltage and 25% improved switching (AC) loss.

Figure 7:
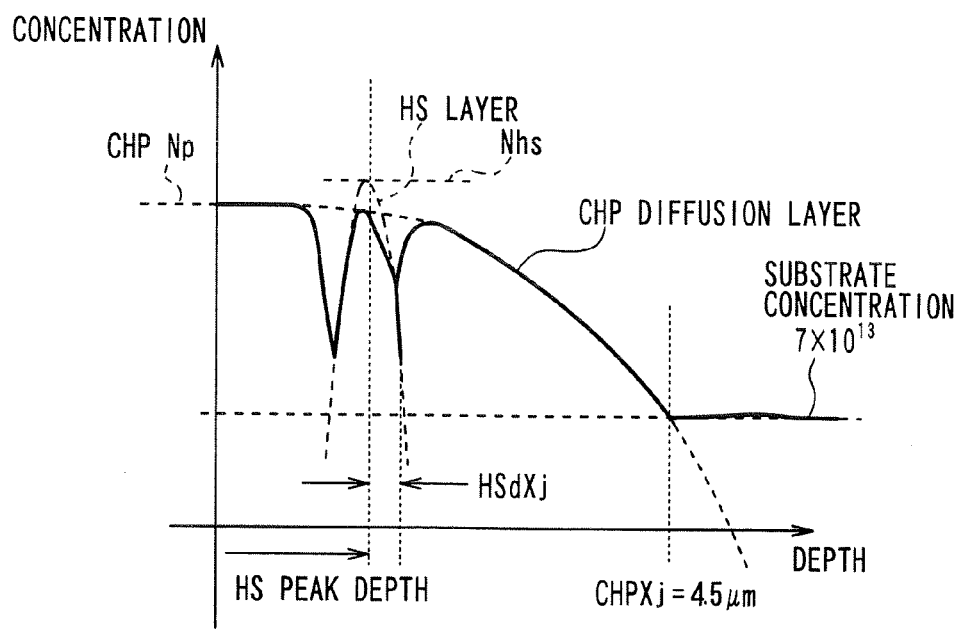
FIG. 7 is a diagram illustrating an impurity profile of a floating layer.

FIG. 7 is a graph illustrating an impurity profile of the floating layer 18. The horizontal axis of the graph represents a depth from the front surface 10a of the semiconductor substrate 1, and the vertical axis of the graph represents an impurity concentration. It is noted that the vertical axis of the graph is logarithmic.

In FIG. 7, the impurity concentration of the semiconductor substrate 10 is $7 \times 10^{13}/cm^3$. "CHP" and "CHP diffusion layer" denote the floating layer 18. "CHPXj" denotes the depth of the floating layer 18 and is 4.5 μm.

In FIG. 7, "HS layer" denotes the hole stopper layer 19. "HS peak depth" denotes a depth where the hole stopper layer 19 peaks in concentration. "Nhs" denotes a concentration of the hole stopper layer 19 at the HS peak depth. "HSdXj" denotes the spread of diffusion of the hole stopper layer 19 in the thickness direction of the semiconductor substrate 10. A half (i.e., one side) of the spread is about 0.1 μm. Based on the above impurity profile, an on-voltage Von, a collector breakdown voltage, and a "Miller" charge ratio of the IGBT element have been evaluated.

Figure 8:
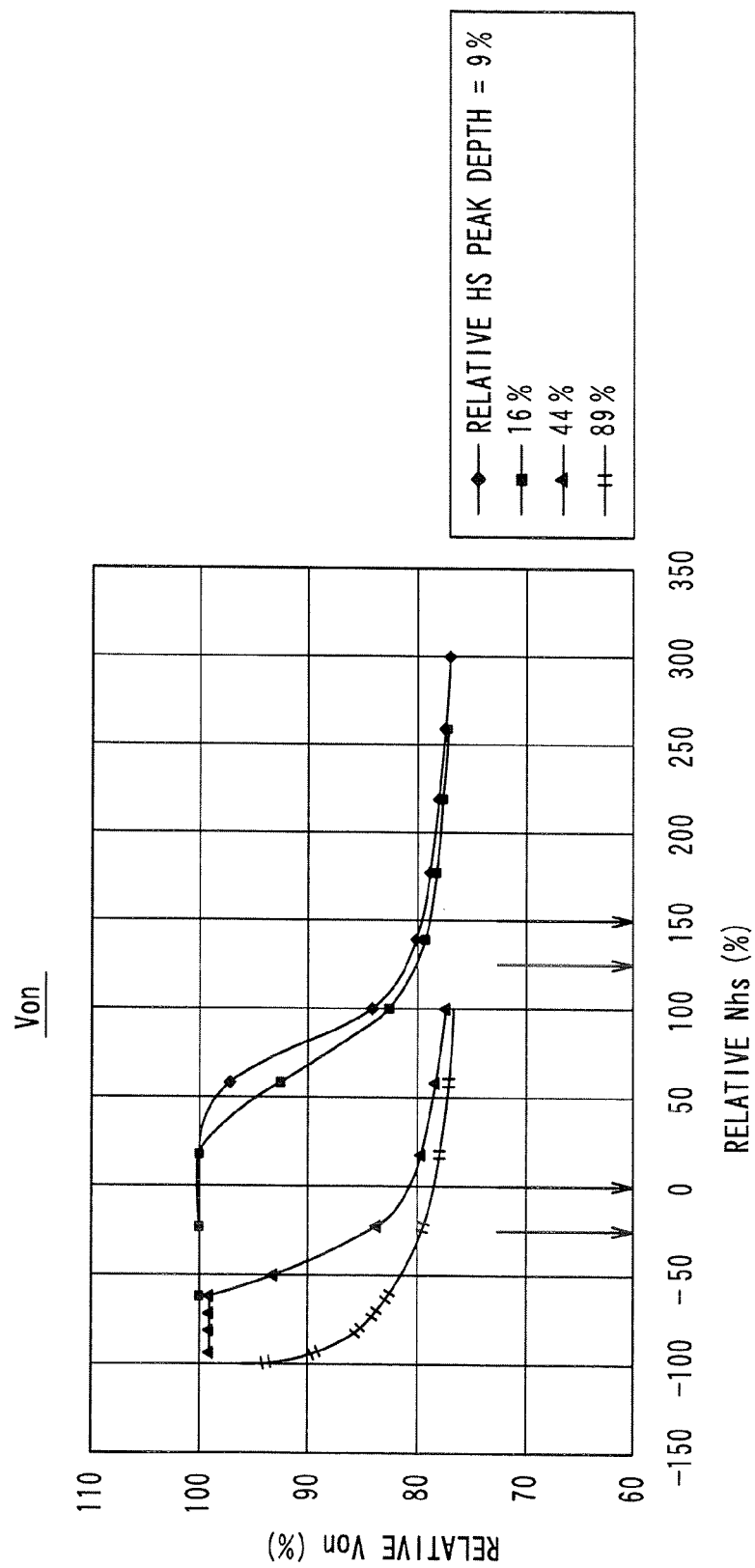
FIG. 8 is a diagram illustrating a relationship between an on-voltage Von and a HS peak concentration Nhs.

FIG. 8 is a graph illustrating a relationship between the on-voltage Von and the HS peak concentration Nhs. In FIG. 8, the horizontal axis of the graph represents a relative HS peak concentration Nhs, and the vertical axis of the graph represents the on-voltage Von. It is noted that the relative HS peak concentration Nhs is the concentration of phosphorus (P) and given by the following equation:

Relative Nhs=((Nhs−Np)/Np)×100 (%)

In the above equation, "Np" denotes the concentration of boron (B).

The relative peak concentration Nhs is a relative peak concentration, when the peak concentration Np of the floating layer 18 is $2.5 \times 10^{17}/cm^3$. In FIG. 8, for example, when the relative peak concentration Nhs of the hole stopper layer 19 is 0%, the concentration of the hole stopper layer 19 is $2.5 \times 10^{17}/cm^3$. For another example, when the relative peak concentration Nhs of the hole stopper layer 19 is 100%, the concentration of the hole stopper layer 19 is $5 \times 10^{17}/cm^3$. For another example, when the relative peak concentration Nhs of the hole stopper layer 19 is minus 100%, the concentration of the hole stopper layer 19 is 0. That is, the relative peak concentration Nhs of minus 100% corresponds to a structure with no hole stopper layer 19.

In the simulation, the relationship between the on-voltage Von and the HS peak concentration Nhs has been evaluated by changing the HS peak depth between four values. It is noted that the HS peak depth in FIG. 8 is defined as a relative HS peak depth relative to CHPXj, which is the depth of the floating layer 18 and 4.5 μm. The on-voltage Von and the HS peak concentration Nhs has been evaluated by changing the relative HS peak depth RHsd to 9%, 16%, 44%, and 89%. For example, when the relative HS peak depth is 9%, the HS peak depth of the hole stopper layer 19 is 0.405 μm. Therefore, in this case, the hole stopper layer 19 is formed at a shallow depth and located closer to the front surface 10a of the semiconductor substrate 10 than the bottom of the trench 12. For another, when the relative HS peak depth is 89%, the HS peak depth of the hole stopper layer 19 is 4.005 μm. Therefore, in this case, the hole stopper layer 19 is formed at a deep depth and located closer to the bottom of the trench 12 than the front surface 10a of the semiconductor substrate 10. It is noted that a depth T of the trench 12 from the front surface 10a of the semiconductor substrate 10 is 4.9 μm.

As can be seen from FIG. 8, as the HS peak depth is smaller, the on-voltage Von is lower over a wide range of the HS peak concentration Nhs.

Figure 9:
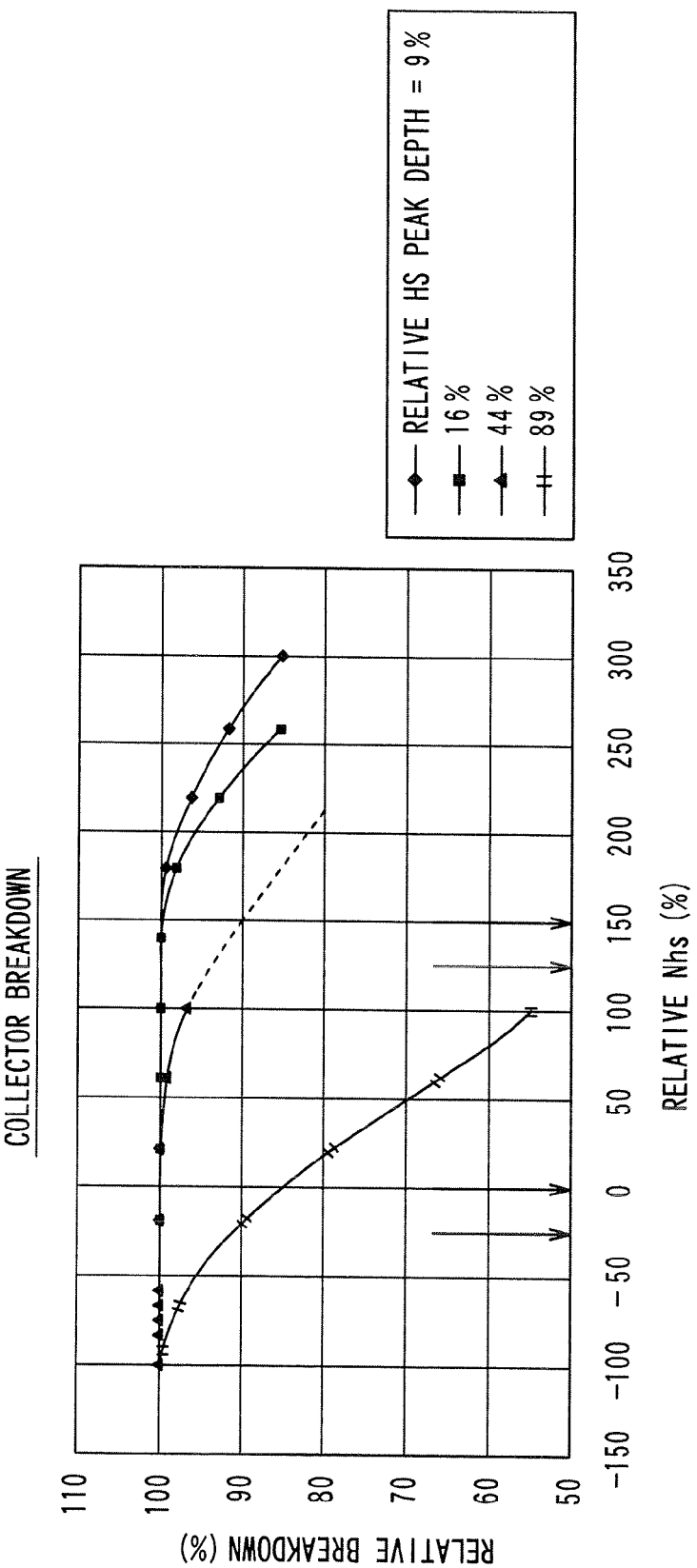
FIG. 9 is a diagram illustrating a relationship between a collector breakdown voltage and the HS peak concentration Nhs.

FIG. 9 is a graph illustrating a relationship between the collector breakdown voltage and the HS peak concentration Nhs. In FIG. 9, the horizontal axis of the graph represents the HS peak concentration Nhs, and the vertical axis of the graph represents the collector breakdown voltage. It is noted that the HS peak concentration Nhs in FIG. 9 is defined as the relative peak concentration Nhs. As can be seen from FIG. 9, as the HS peak depth is smaller, the collector breakdown voltage is lower over a wide range of the HS peak concentration Nhs.

Figure 10:
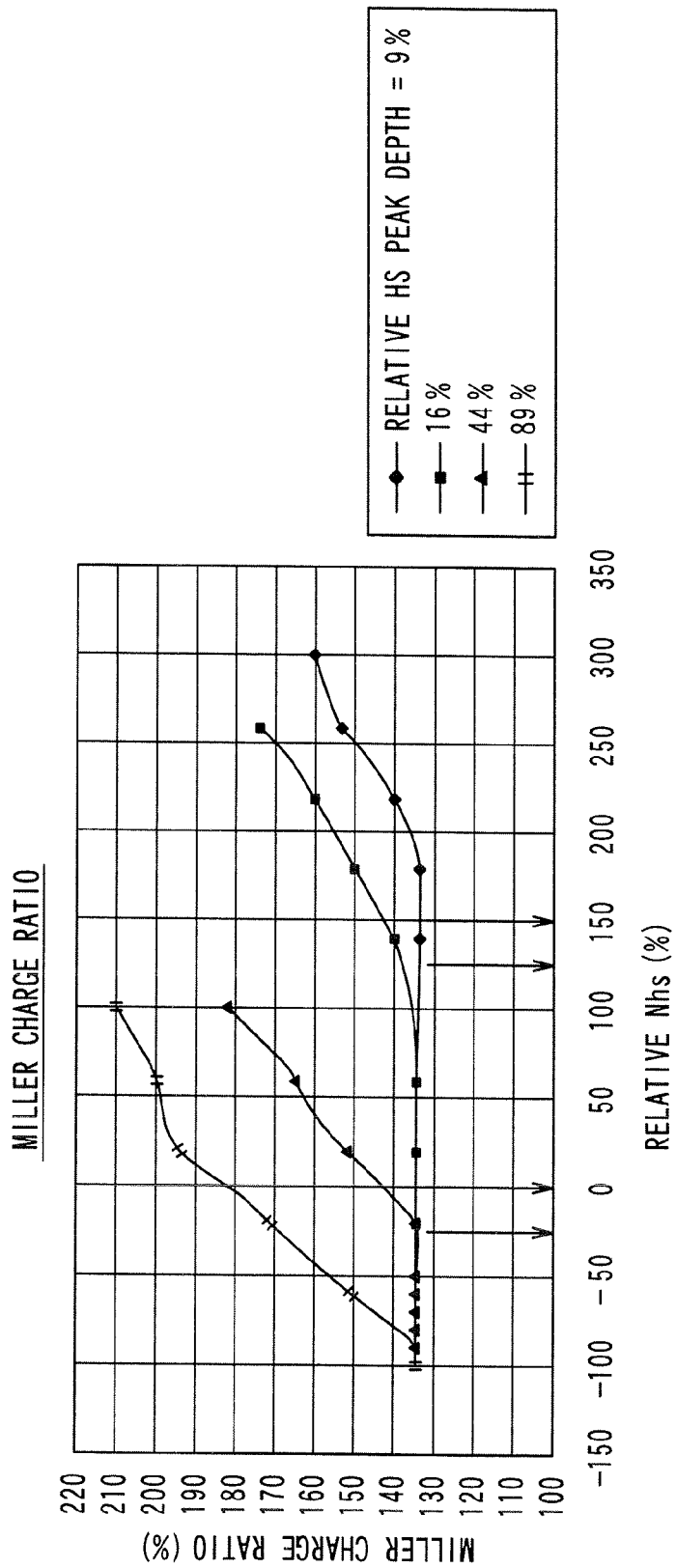
FIG. 10 is a diagram illustrating a relationship between a Miller charge ratio and the HS peak concentration Nhs.

FIG. 10 is a graph illustrating a relationship between the Miller charge ratio and the HS peak concentration Nhs. In FIG. 10, the horizontal axis of the graph represents the HS peak concentration Nhs, and the vertical axis of the graph represents the Miller charge ratio. It is noted that the HS peak concentration Nhs in FIG. 10 is defined as the relative peak concentration Nhs. The Miller charge ratio represents a ratio between the gate-to-collector charge and the gate-to-emitter charge during gate charging. As capacitive coupling between gate and collector is smaller, the Miller charge ratio becomes smaller so that high speed switching can be achieved.

As can be seen from FIG. 10, when the HS peak depth is large such as 44% or 89%, the Miller charge ratio increases with an increase in the HS peak concentration Nhs. In contrast, when the HS peak depth is small such as 9% or 16%, the Miller charge ratio is kept constant over a wide range of the HS peak concentration Nhs so that high speed switching can be achieved.

Figure 11:
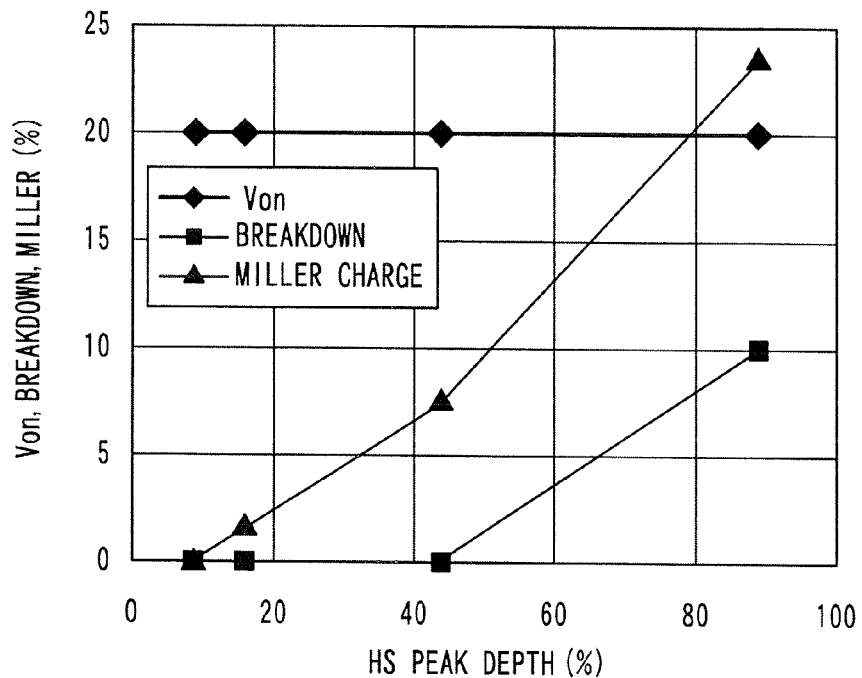
FIG. 11 is a diagram illustrating dependencies of the on-voltage Von, the collector breakdown voltage, and the Miller charge ratio on the HS peak depth.

FIG. 11 is a graph illustrating dependencies of the on-voltage Von, the collector breakdown voltage, and the Miller charge ratio on the HS peak depth. In FIG. 11, the horizontal axis of the graph represents the HS peak depth, and the HS peak depth is 9%, 16%, 44%, and 89%, and the vertical axis of the graph represents the percentage of decrease in the on-voltage Von, the percentage of decrease in the collector breakdown voltage, and the percentage of increase in the Miller charge ratio. It is noted that the graph of FIG. 11 is plotted at points (i.e., points indicated by arrows in FIG. 8) corresponding to the hole stopper concentration where the percentage of reduction in the on-voltage Von is 20%.

As can be seen from FIG. 11, the on-voltage Von is independent of the HS peak depth and constant. The collector breakdown voltage sharply decreases when the HS peak depth exceeds about 50%. The Miller charge ratio depends on the HS peak depth and sharply increases when the HS peak depth exceeds about 20%. Therefore, it is preferable that the HS peak depth from the front surface 10a of the semiconductor substrate 1 be equal to or less than 50% of the depth of the floating layer 18 to prevent the decrease in the collector breakdown voltage. It is more preferable that the HS peak depth from the front surface 10a of the semiconductor substrate 1 be equal to or less than 20% of the depth of the floating layer 18 to prevent the increase in the Miller charge ratio. The increase in the Miller charge ratio results in an increase in switching loss. Therefore, in order to reduce AC loss, it is important to form the hole stopper layer 19 at a shallower depth in the floating layer 18.

In summary, the simulation result indicates that the characteristics of the IGBT element can be improved by forming the hole stopper layer 19 at a shallower depth in the floating layer 18.

Figure 20:
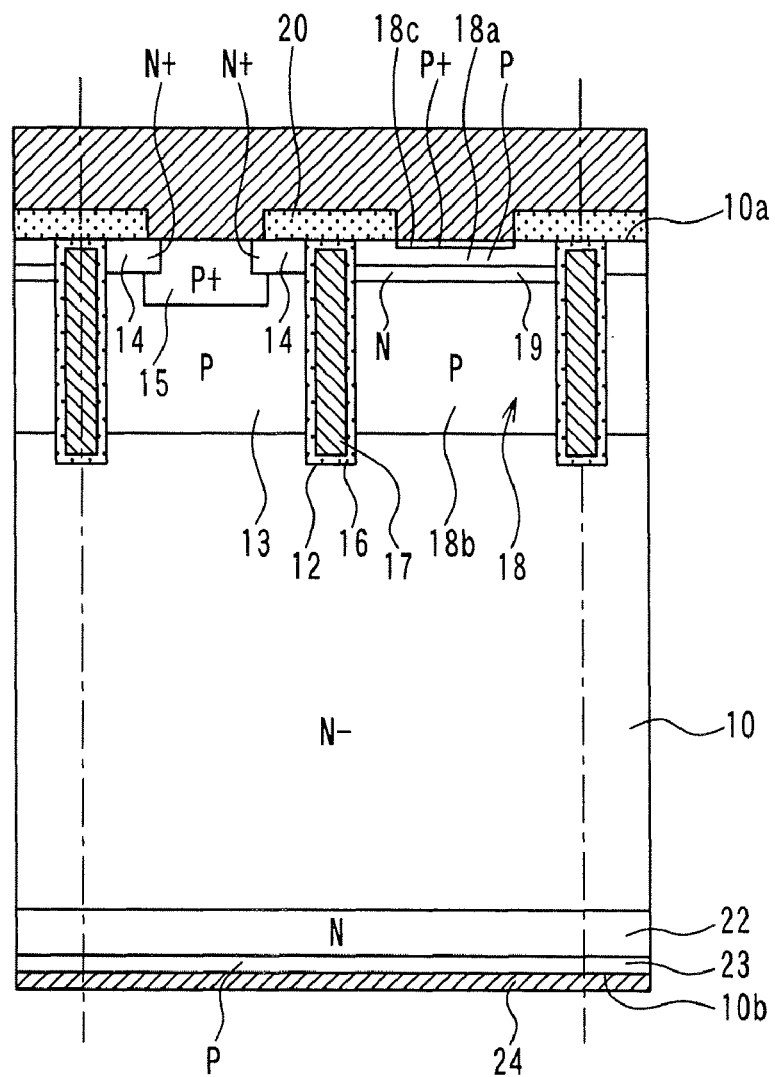
FIG. 20 is a diagram illustrating a partial cross-sectional view of a RC-IGBT element according to a ninth embodiment of the present invention.
Figure 22:
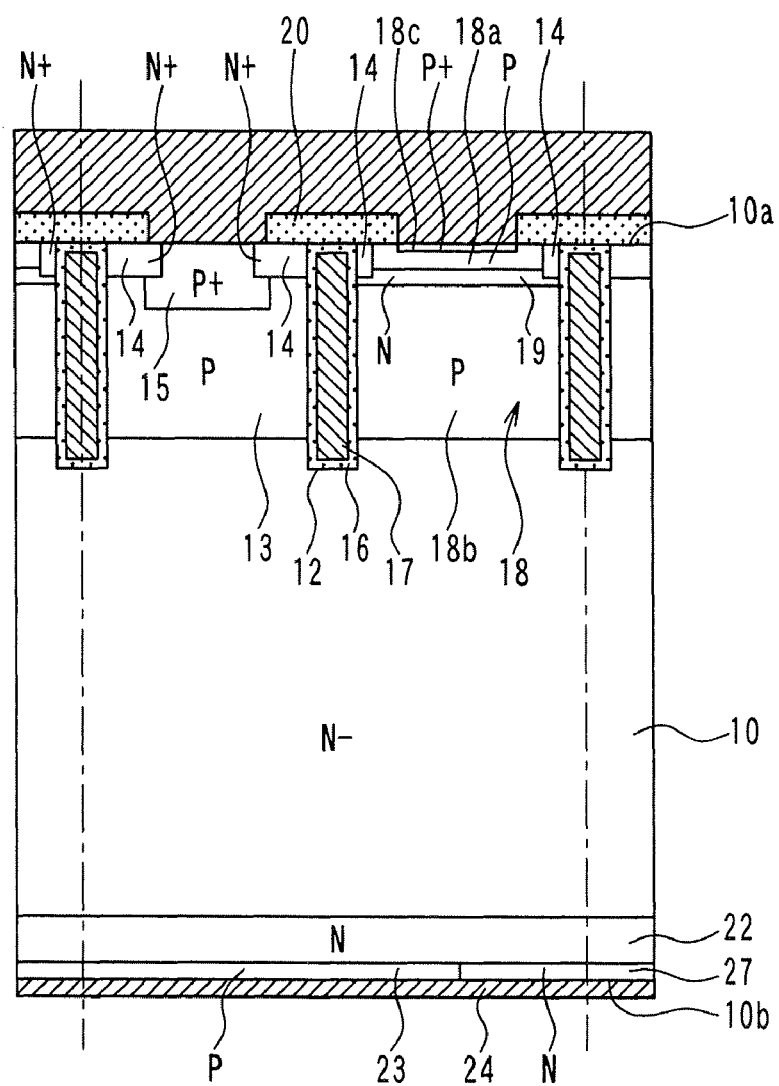
FIG. 22 is a diagram illustrating a partial cross-sectional view of a RC-IGBT element according to an eleventh embodiment of the present invention.

However, if the hole stopper layer 19 is exposed to the front surface 10a of the semiconductor substrate 10 and comes in contact with the emitter electrode 21 as a surface electrode, a parasitic NPN transistor is formed so that a surge resistance will be degraded. Therefore, it is preferable that the P-type first layer 18a remain on the front surface 10a side. In this case, it is preferable that the hole stopper layer 19 be formed at a depth of 0.1 μm or more from the front surface 10a. As can be understood from FIGS. 5A and 5B, in order to form the hole stopper layer 19 at the depth of 0.1 μm or more, there is a need to form the hole stopper layer 19 by ion implantation with an energy of 100 keV or more. Alternatively, as shown in FIGS. 20 and 22, which will be described later, a thin P-type contact region 18c can be formed above the hole stopper layer 19.

As described above, according to the first embodiment, the N-type hole stopper layer 19 is formed in the P-type floating layer 18 of the dummy element. Further, the floating layer 18 is divided into the first layer 18a and the second layer 18b, and the first layer 18a is connected to the emitter electrode 21, i.e., grounded.

Since the first layer 18a is electrically connected to the emitter electrode 21, the floating layer 18 is clamped to a potential (i.e., GND) of the emitter electrode 21. In such an approach, there is almost no charge stored in a feedback capacitor formed in a path from the collector electrode 24 to the gate electrode 17 through the floating layer 18. Accordingly, there is almost no charge discharged at the time of switching. Therefore, switching time is reduced so that switching loss can be reduced. Conversely, in conventional structures, since a lot of time is required to discharge a large amount of charge that is stored in a floating layer at the time of switching, switching loss occurs.

It is noted that holes may be drawn from the semiconductor substrate 10 through the floating layer 18 into the emitter electrode 21 due to the fact that the first layer 18a is grounded to the emitter electrode 21. However, the N-type hole stopper layer 19 in the P-type floating layer 18 can serve as a potential barrier. Therefore, the hole stopper layer 19 can prevent holes from being drawn from the semiconductor substrate 10 or can reduce the amount of holes drawn from the semiconductor substrate 10. That is, the hole stopper layer 19 can suitably limit the flow of holes. Because of the hole stopper layer 19, it is less likely that holes flowing in the semiconductor substrate 10 are drawn to the emitter electrode 21. Thus, the concentrations of holes and electrons in the semiconductor substrate 10 rise so that conductivity modulation can be accelerated. As a result, a resistance of the semiconductor substrate 10 decreases so that the on-voltage of the IGBR element can be lowered.

In this way, both low on-voltage and low switching loss are achieved by connecting the hole stopper layer 19 in the floating layer 18 of the dummy element to the emitter electrode 21.

Further, since the floating layer 18 is connected to the emitter electrode 18, the dynamic breakdown voltage and the static breakdown voltage of the entire IGBT element are improved so that voltage breakdown resistance design can be facilitated. Furthermore, since the hole stopper layer 19 is located in a shallow region of the floating layer 18, the voltage breakdown resistance design can be facilitated.

For example, the HS peak depth of the hole stopper layer 19 from the front surface 10a of the semiconductor substrate 1 can be equal to or less than 50%, preferably 20% of the depth of the floating layer 18 from the front surface 10a of the semiconductor substrate 1. When the hole stopper layer 19 is located at such a shallower depth in the floating layer 18, the loss of the IGBT element can be effectively reduced.

The channel layer 13 corresponds to a channel region in claims. The floating layer 18 corresponds to a floating region in claims. The first layer 18a corresponds to a first region in claims. The second layer 10b corresponds to a second region in claims.

(Second Embodiment)

A second embodiment of the present invention is described below with reference to FIGS. 12A, 12B, and 13. The second embodiment differs from the first embodiment in the following points. According to the first embodiment, only the IGBT element is formed in the cell area 2. In contrast, according to the second embodiment, a diode element is formed in the cell area 2 in addition to the IGBT element so that a reverse-conducting IGBT (RC-IGBT) can be formed.

In the cell area 2, an IGBT region, where the IGBT element is formed, and a diode region, where the diode element is formed, are alternately arranged.

Figure 12A:
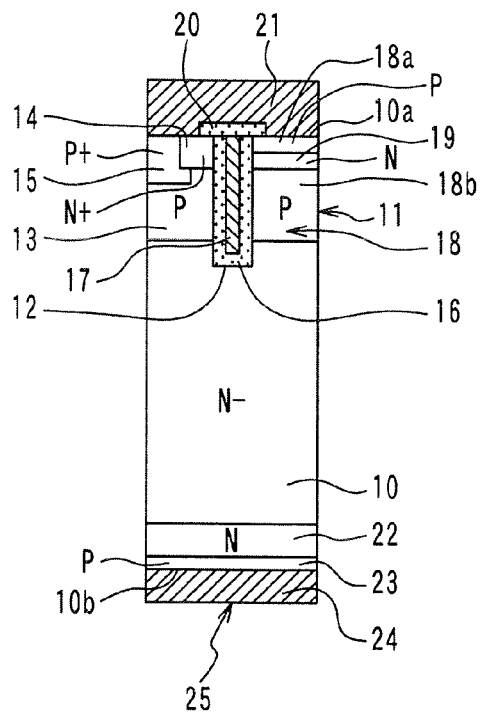
FIG. 12A is a diagram illustrating a cross-sectional view of a unit structure of an IGBT element of a RC-IGBT element according to a second embodiment of the present invention.
Figure 12B:
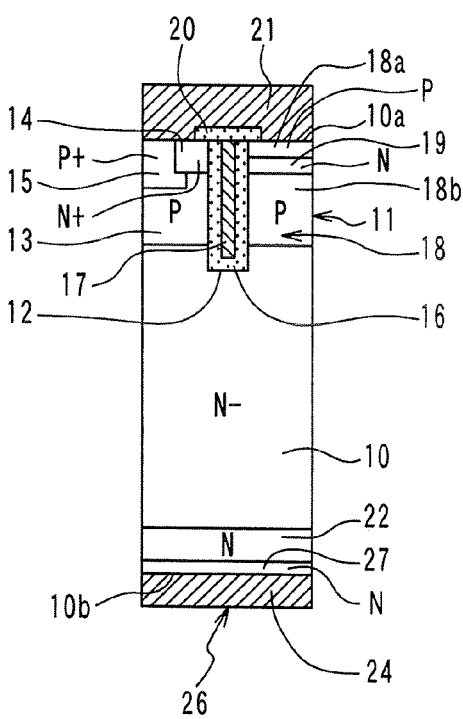
FIG. 12B is a diagram illustrating a cross-sectional view of a unit structure of a diode element of the RC-IGBT element according to the second embodiment.

FIG. 12A corresponds to a unit structure of the IGBT element formed in an IGBT region 25 of the cell area 2, and FIG. 12B corresponds to a unit structure of the diode element formed in a diode region 26 of the cell area 2.

As shown in FIG. 12A, in the IGBT region 25, the field stop layer 22 is formed on the front surface 10a side of the semiconductor substrate 10, and the P-type collector layer 23 is formed on the field stop layer 22. Thus, in the IGBT region 25, holes are supplied from the collector layer 23.

In contrast, as shown in FIG. 12B, in the diode region 26, an N-type cathode layer 27 is formed on the field stop layer 22. Thus, in the diode region 26, a diode is formed between emitter and collector.

In summary, the structure of the second embodiment can be achieved by modifying the structure of the first embodiment in such a manner that the collector layer 23 is partially replaced with the cathode layer 27. The IGBT region 25 having the collector layer 23 acts as an IGBT element, and the diode region 26 having the cathode layer 27 acts as a diode element. In the diode region 26, the collector electrode 24 serves as a cathode electrode.

Figure 13:
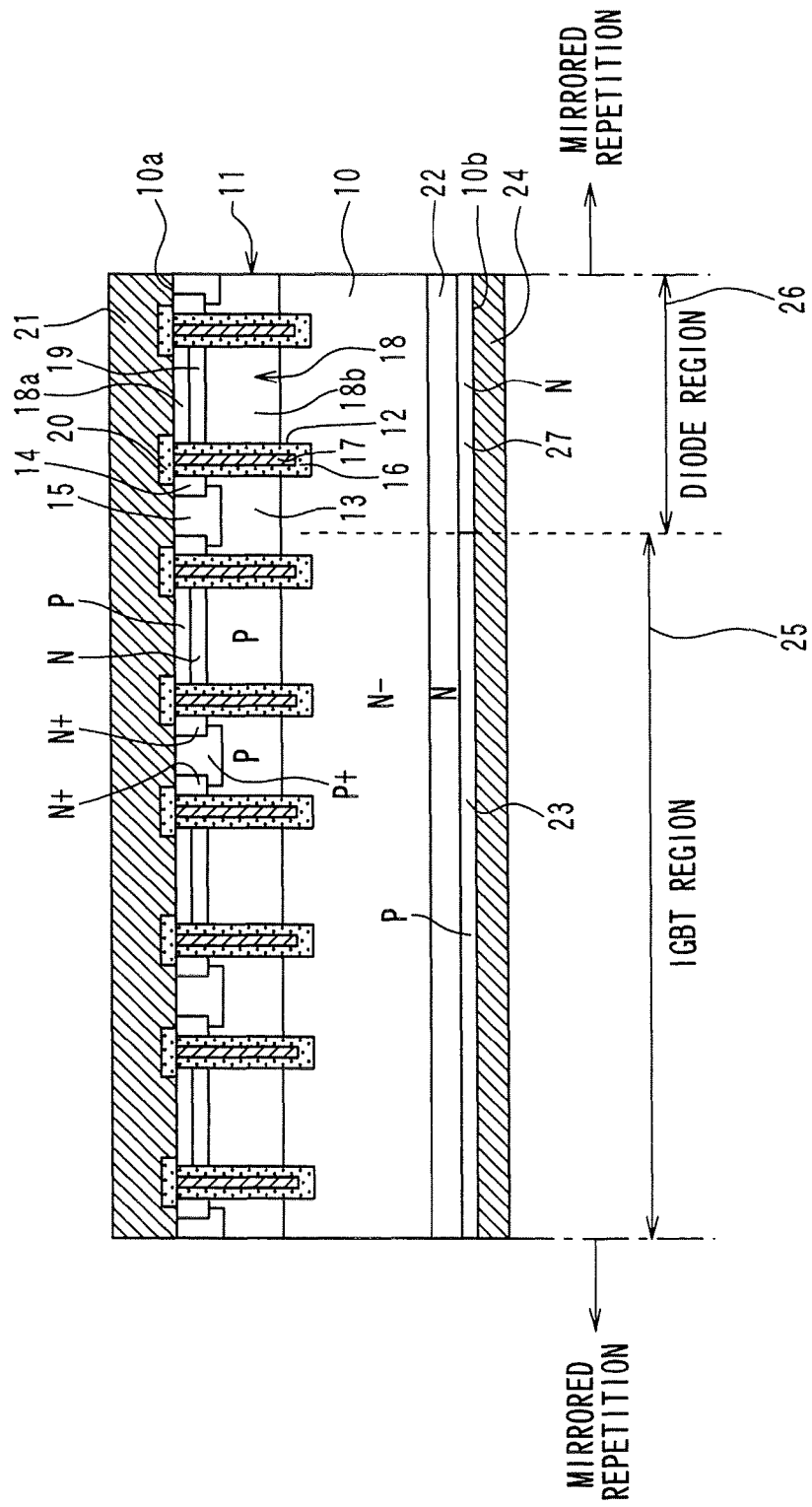
FIG. 13 is a diagram illustrating a partial cross-sectional view of a RC-IGBT element according to the second embodiment of the present invention.

The unit structure of the IGBT element shown in FIG. 12A and the unit structure of the diode element shown in FIG. 12B are repeatedly arranged in a predetermined pattern so that a structure shown in FIG. 13 can be formed. It is noted that the structure shown in FIG. 13 is repeatedly arranged in a mirrored manner over the cell area 2.

Specifically, as shown in FIG. 13, on the front surface 10a side of the semiconductor substrate 10, the channel layer 13 having the emitter region 14 and the floating layer 18 having the hole stopper layer 19 are repeatedly arranged over the IGBT region 25 and the diode region 26. In contrast, on the back surface 10b side of the semiconductor substrate 10, the collector layer 23 is formed on the field stop layer 22 in the IGBT region 25, and the cathode layer 27 is formed on the field stop layer 22 in the diode region 26. In this way, the IGBT region 25 and the diode region 26 are distinguished from each other based on whether the collector layer 23 or the cathode layer 27 is formed on the field stop layer 22.

As described above, according to the second embodiment, the cell area 2 is configured as a RC-IGBT. In this case, since channel is formed over the cell area 2, electronic current flow is increased so that an on-voltage of the IGBT can be reduced.

Like the first embodiment, the P$^+$-type body region 15 is not formed in the floating layer 18, and the hole stopper layer 19 is located at the depth shallower than the depth of the bottom of the body region 15 that is formed in the channel layer 13. Therefore, since an increase in the amount of holes injected from the body region 15 to the semiconductor substrate 10 is prevented, an increase in recovery loss of the diode element can be prevented.

(Third Embodiment)

Figure 14:
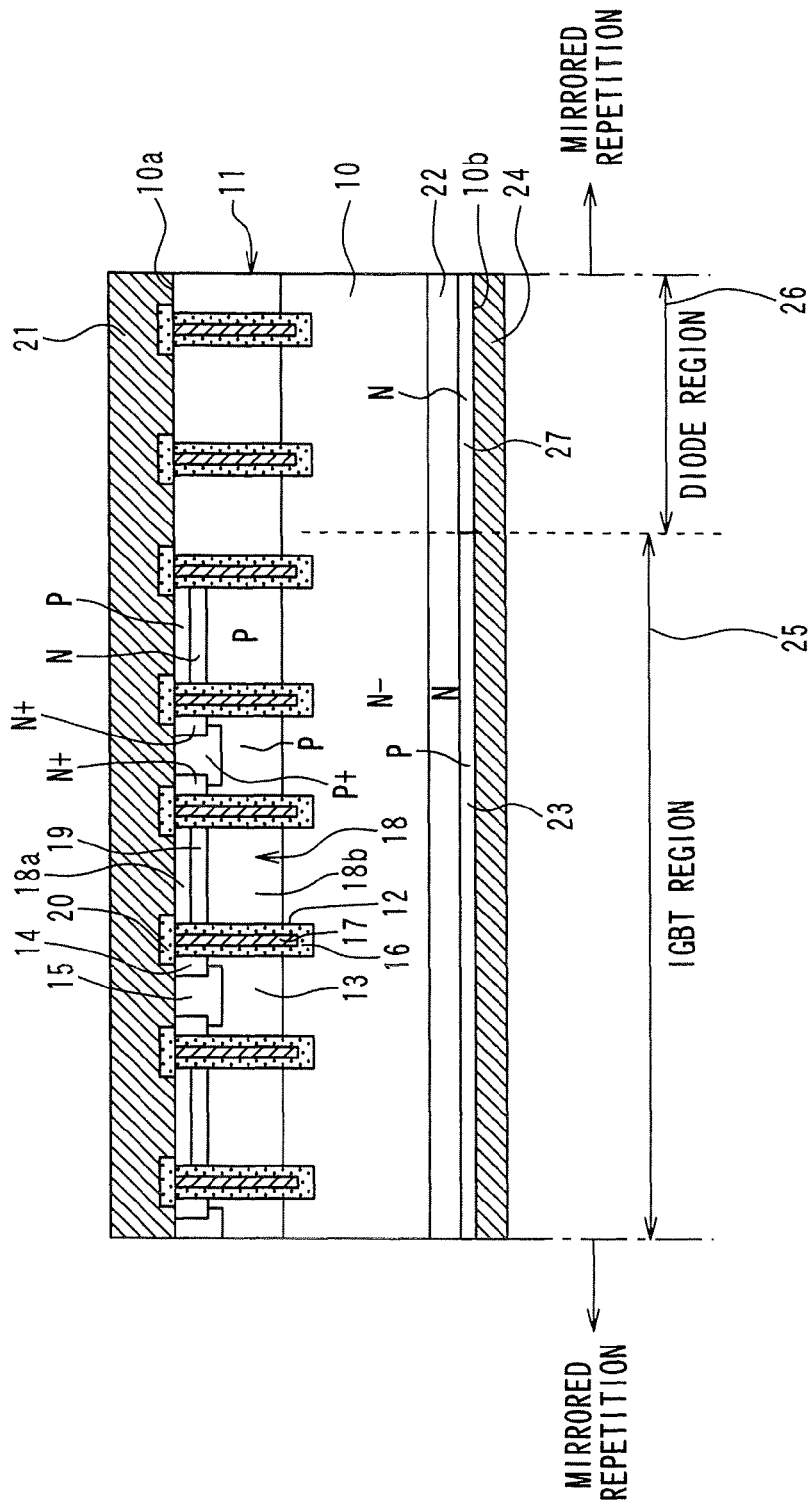
FIG. 14 is a diagram illustrating a partial cross-sectional view of a RC-IGBT element according to a third embodiment of the present invention.

A third embodiment of the present invention is described below with reference to FIG. 14. The third embodiment differs from the second embodiment in the following points. As shown in FIG. 14, like the second embodiment, the channel layer 13 having the emitter region 14 and the floating layer 18 having the hole stopper layer 19 are repeatedly arranged in the IGBT region 25.

However, unlike the second embodiment, the emitter region 14 and the hole stopper layer 19 are not formed in the base layer 11 in the diode region 26. That is, the diode region 26 has no channel layer 13. In other words, the diode region 26 has no IGBT element portion. Therefore, it is less likely that a forward voltage of the diode element is affected by the IGBT element.

In this way, according to the third embodiment, the diode element is located on the border between the IGBT region 25 and the diode region 26.

(Fourth Embodiment)

Figure 15:
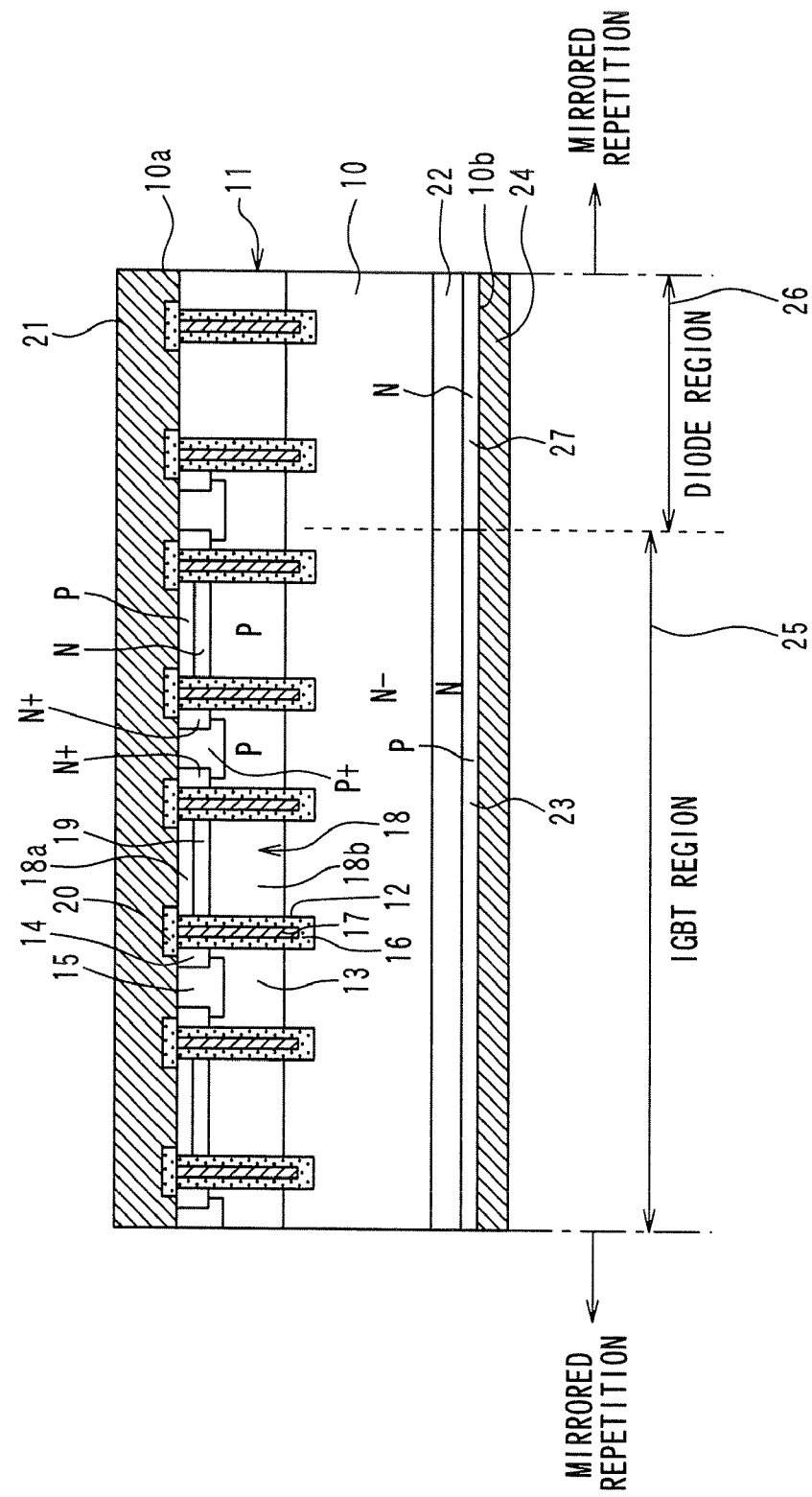
FIG. 15 is a diagram illustrating a partial cross-sectional view of a RC-IGBT element according to a fourth embodiment of the present invention.

A fourth embodiment of the present invention is described below with reference to FIG. 15. The fourth embodiment differs from the third embodiment in the following points. As shown in FIG. 15, according to the fourth embodiment, the emitter region 14 is formed in the base layer 11 that is located on the border between the collector layer 23 and the cathode layer 27 in the depth direction of the trench 12. The base layer 11 serves as the channel layer 13. That is, the IGBT region 25 overlaps an outer edge of the diode region 26 so that the IGBT element can be located on the border between the IGBT region 25 and the diode region 26.

Even when the IGBT element is located on the border between the IGBT region 25 and the diode region 26, the diode region 26 has almost no IGBT element portion. Therefore, like the third embodiment, it is less likely that a forward voltage of the diode element is affected by the IGBT element.

(Fifth Embodiment)

Figure 16:
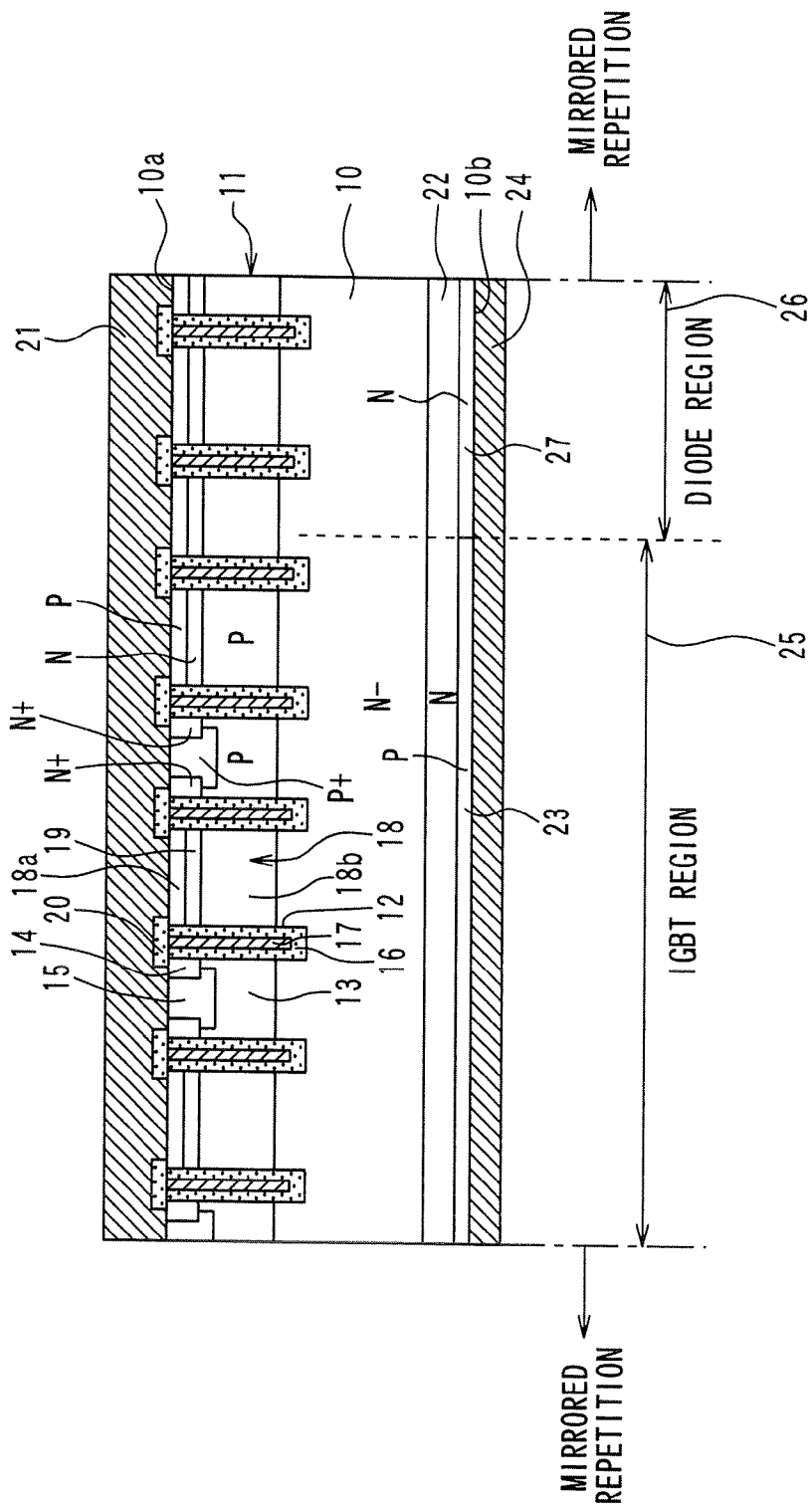
FIG. 16 is a diagram illustrating a partial cross-sectional view of a RC-IGBT element according to a fifth embodiment of the present invention.

A fifth embodiment of the present invention is described below with reference to FIG. 16. The fifth embodiment differs from the second embodiment in the following points. As shown in FIG. 16, according to the fifth embodiment, the hole stopper layer 19 is formed in each base layer 11 (i.e., floating layer 18) in the diode region 26. It is noted that the diode element is located on the border between the IGBT region 25 and the diode region 26.

Since the hole stopper layer 19 is formed in each floating layer 18 in the diode region 26, the amount of holes injected from the semiconductor substrate 10 to the floating layer 18 in the diode region 26 can be reduced.

(Sixth Embodiment)

Figure 17:
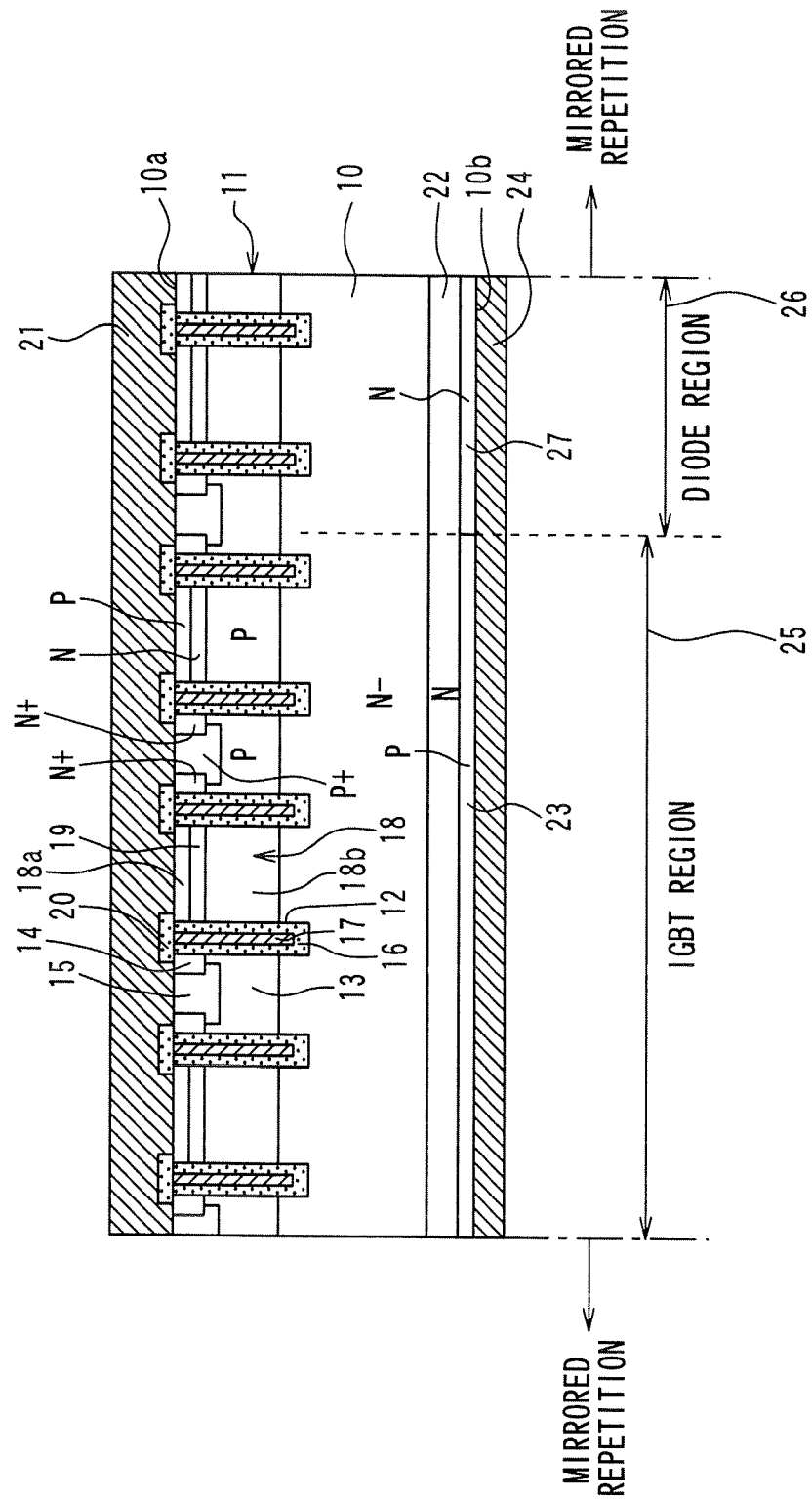
FIG. 17 is a diagram illustrating a partial cross-sectional view of a RC-IGBT element according to a sixth embodiment of the present invention.

A sixth embodiment of the present invention is described below with reference to FIG. 17. The sixth embodiment differs from the fifth embodiment in the following points. As shown in FIG. 17, according to the sixth embodiment, the emitter region 14 is formed in the base layer 11 that is located on the border between the collector layer 23 and the cathode layer 27 in the depth direction of the trench 12. The base layer 11 serves as the channel layer 13. That is, the IGBT region 25 overlaps an outer edge of the diode region 26 so that the IGBT element can be located on the border between the IGBT region 25 and the diode region 26.

(Seventh Embodiment)

A seventh embodiment of the present invention is described below with reference to FIGS. 18A and 18B. The seventh embodiment differs from the second through sixth embodiments in the following points. FIG. 18A is a diagram illustrating a plane view of a semiconductor chip 1 according to the seventh embodiment. FIG. 18B is a diagram illustrating a part of a cross-sectional view taken along the line XVIII in FIG. 18A.

As shown in FIG. 18A, according to the seventh embodiment, the IGBT region 25 and the diode region 26 are alternately arranged in a stripe pattern. As shown in FIG. 18B, on the back surface 10b side of the semiconductor substrate 10, the P$^+$-type collector layer 23 is formed on the field stop layer 22 in the IGBT region 25, and the N$^+$-type cathode layer 27 is formed on the field stop layer 22 in the diode region 26. Thus, the collector layer 23 and the cathode layer 27 are alternately arranged in a stripe pattern.

Further, according to the seventh embodiment, the emitter region 14 and the body region 15 are partially formed in the diode region 26 near the IGBT region 25. In such an approach, the channel area of the IGBT element is increased so that the on-voltage Von can be reduced.

(Eighth Embodiment)

Figure 19:
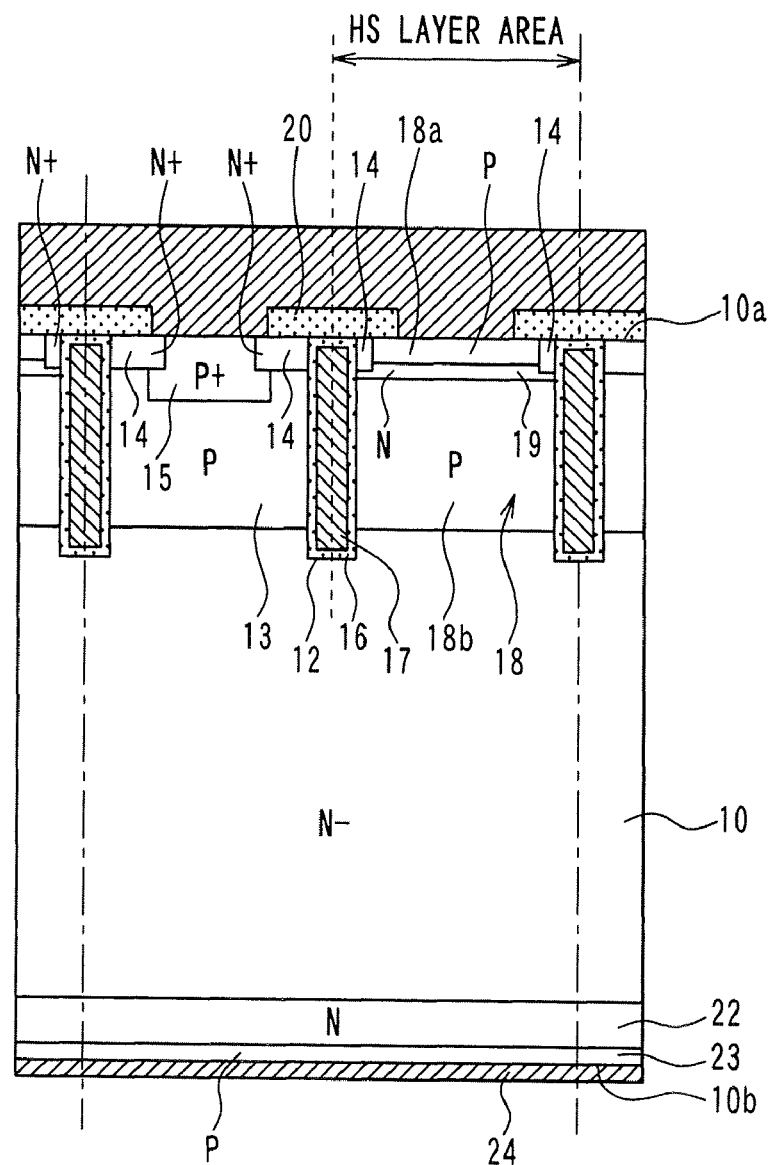
FIG. 19 is a diagram illustrating a partial cross-sectional view of a RC-IGBT element according to an eighth embodiment of the present invention.

An eighth embodiment of the present invention is described below with reference to FIG. 19. FIG. 19 is a diagram illustrating a partial cross-sectional view of an IGBT element according to the eighth embodiment. The eighth embodiment differs from the preceding embodiments in the following points. When the hole stopper layer 19 is formed by ion implantation as mentioned previously, misalignment of the hole stopper layer 19, i.e., a loss of the hole stopper layer 19 may occur. To prevent this, as shown in FIG. 19, the emitter region 14 can be elongated to the floating layer 18. In such an approach, an emitter area where ion implantation is applied to form the emitter region 14 can overlap an HS layer area where ion implantation is applied to form the hole stopper layer 19. It is noted that elongation of the hole stopper layer 19 to the channel layer 13 may affect the threshold voltage Vth. Therefore, it is preferable that the emitter region 14 be elongated to the floating layer 18.

Although FIG. 19 shows an IGBT element, the eighth embodiment can be applied to a RC-IGBT.

(Ninth Embodiment)

A ninth embodiment of the present invention is described below with reference to FIG. 20. FIG. 20 is a diagram illustrating a partial cross-sectional view of an IGBT element according to the ninth embodiment. The ninth embodiment differs from the preceding embodiments in the following points.

In the processing embodiments, a contact resistance may occur if a surface concentration of the first layer 18a on the hole stopper layer 19 is low. To prevent this problem, according to the ninth embodiment, a $P^+$-type thin contact region 18c is formed in a surface portion of the first layer 18a of the floating layer 18. Since the contact region 18c is used for contact purpose, the contact region 18c is formed at a very shallow depth in the first layer 18a. It is noted that the body region 15 adjacent to the emitter region 14 is formed deeper than the emitter region 14 so that high resistance to surge can be achieved.

The contact region 18c can be formed after forming the contact hole 20a in the interlayer dielectric layer 20. In the example shown in FIG. 20, the cell area 2 is configured as an IGBT element. Alternatively, the cell area 2 can be configured as a RC-IGBT.

(Tenth Embodiment)

Figure 21:
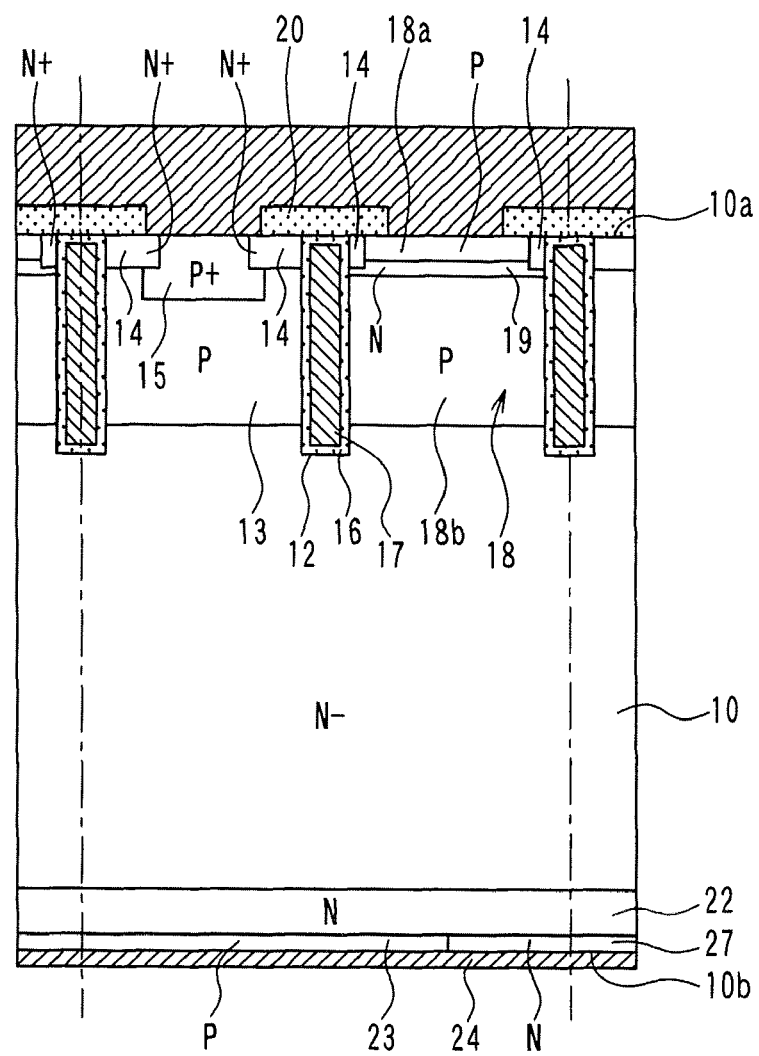
FIG. 21 is a diagram illustrating a partial cross-sectional view of a RC-IGBT element according to a tenth embodiment of the present invention.

A tenth embodiment of the present invention is described below with reference to FIG. 21. The tenth embodiment differs from the eighth embodiment in the following points. FIG. 21 illustrates the border between the IGBT region 25 and the diode region 26.

According to the eighth embodiment, the cell area 2 is configured as an IGBT element. In contrast, according to the tenth embodiment, the cell area 2 is configured as a RC-IGBT. Further, according to the tenth embodiment, the impurity concentration of the floating layer 18 (i.e., anode layer) is lower than the impurity concentration of the channel layer 13.

(Eleventh Embodiment)

An eleventh embodiment of the present invention is described below with reference to FIG. 22. FIG. 22 is a diagram illustrating a partial cross-sectional view of a RC-IGBT according to the eleventh embodiment. As shown in FIG. 22, the elongation structure of the emitter region 14 according to the eighth embodiment, the contact region 18c of the floating layer 18 according to the ninth embodiment, and the low-concentration floating layer 18 according to the tenth embodiment can be combined together as needed. In an example shown in FIG. 22, since the $P^+$-type contact region 18c is formed in a very shallow region from the front surface 10a, hole-injection efficiency of the $P^+$-type contact region 18c is less than that of the $P^+$-type body region 15, which is formed in a deep region from the front surface 10a. Therefore, the AC loss of the RC-IGBT can be reduced.

(Twelfth Embodiment)

A twelfth embodiment of the present invention is described below with reference to FIGS. 23A and 23B. The twelfth embodiment differs from the preceding embodiments in the following points. In the preceding embodiments, the trenches 12 are arranged at regular intervals so that the channel layer 13 and the floating layer 18 can have the same width. In contrast, according to the twelfth embodiment, the trenches 12 are arranged at irregular intervals so that the channel layer 13 and the floating layer 18 can have different widths.

Figure 23A:
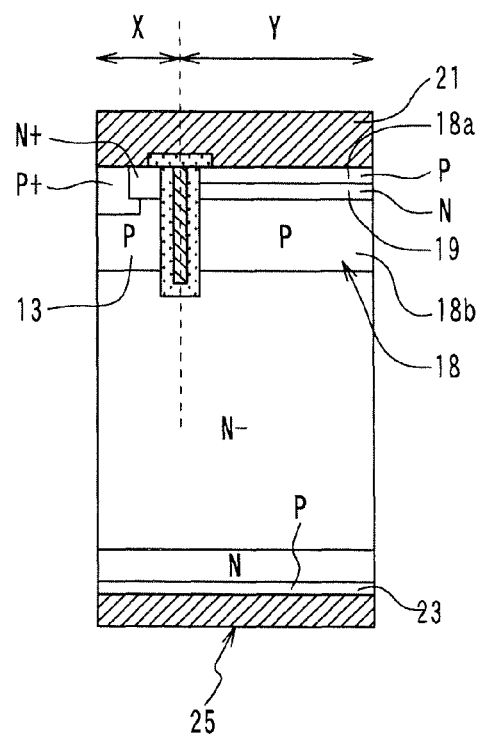
FIG. 23A is a diagram illustrating a cross-sectional view of a unit structure of an IGBT element of a RC-IGBT element according to a twelfth embodiment of the present invention.
Figure 23B:
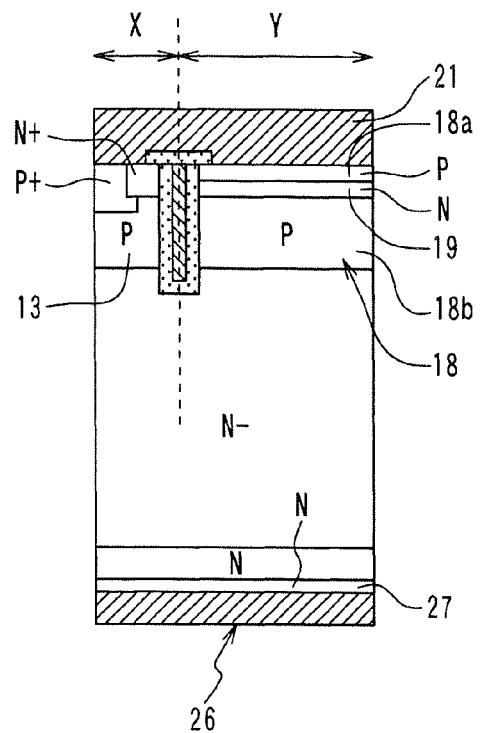
FIG. 23B is a diagram illustrating a cross-sectional view of a unit structure of a diode element of the RC-IGBT element according to the twelfth embodiment.

In the example shown in FIGS. 23A and 23B, the trenches 12 are arranged at irregular intervals in such a manner that the width of the floating layer 18 can be greater than the width of the channel layer 13.

Specifically, the trenches 12 between which the channel layer 13 is formed are arranged at a first interval of 2X, and the trenches 12 between which the floating layer 18 is formed are arranged at a second interval of 2Y. X and Y are positive values, and Y is greater than X. It is noted that FIGS. 23A and 23B illustrate unit structures of the IGBT element and the diode element. Therefore, the width of the channel layer 13 corresponds to 2X, and the width of the floating layer 18 corresponds to 2Y.

For example, the structures shown in FIGS. 23A and 23B can be achieved by increasing the width of the floating layer 18 of the structures shown in FIGS. 12A and 12B.

As described above, according to the twelfth embodiment, the width of the floating layer 18 is greater than the width of the channel layer 13. In such an approach, while a portion of the IGBT region 25 serving as a gate is reduced, a portion of the IGBT region 25 connected to the emitter region 14 is increased. Therefore, there is almost no charge stored in feedback capacity so that high speed switching of the IGBT element can be achieved.

In summary, according to the preceding embodiments, X=Y so that the width of the floating layer 18 can be equal to the width of the channel layer 13. In contrast, according to the twelfth embodiment, X<Y so that the width of the floating layer 18 can be greater than the width of the channel layer 13. That is, the trenches 12 can be formed such that $X \leq Y$.

(Thirteenth Embodiment)

A thirteenth embodiment of the present invention is described below with reference to FIG. 24. The thirteenth embodiment differs from the preceding embodiments in the following points. The preceding embodiments are based on a vertical trench gate IGBT in which the gate electrode 17 is buried through the gate insulation layer 16 into the trench 12 formed in the semiconductor substrate 10. In contrast, the thirteenth embodiment is based on a vertical planar gate IGBT.

Figure 24:
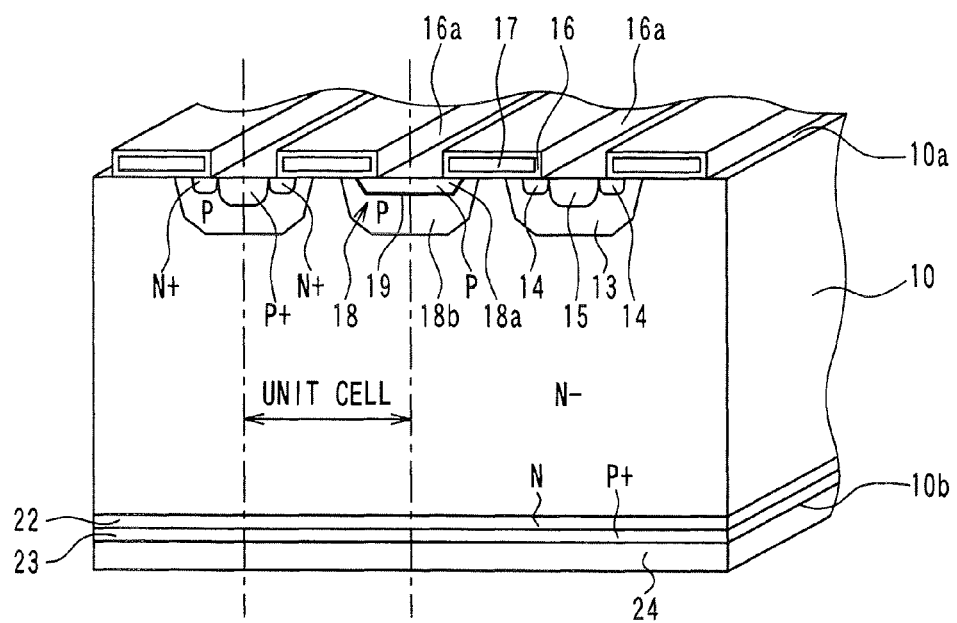
FIG. 24 is a diagram illustrating a perspective cross-sectional view of an IGBT element according to a thirteenth embodiment of the present invention.

FIG. 24 is a perspective cross-sectional view of the IGBT element according to the thirteenth embodiment and corresponds to FIG. 3, for example.

As shown in FIG. 24, P-type regions are formed on the front surface 10a side of the $N^-$-type semiconductor substrate 10. The P-type regions are arranged in a stripe pattern in a direction parallel to the front surface 10a of the semiconductor substrate 10. The P-type regions correspond to the channel layer 13 and the floating layer 18 in the preceding embodiments. The P-type region corresponding to the channel layer 13 is hereinafter called a channel region 13, and the P-type region corresponding to the floating layer 18 is hereinafter called a floating region 18.

The N+-type emitter regions 14 are formed in a surface portion of the channel region 13. The N+-type emitter regions 14 extend along the channel region 13 and are spaced from each other. The P+-type body region 15 is formed between the emitter regions 14 and extends along the emitter regions 14. The N-type hole stopper layer 19 is formed in the floating region 18 and divides the floating region 18 into the first layer 18a and the second layer 18b. The first layer 18a is located on the front surface 18a side of the semiconductor substrate 10 with respect to the hole stopper layer 19. The second layer 18b is located on the back surface 18b side of the semiconductor substrate 10 with respect to the hole stopper layer 19. The first layer 18a is hereinafter called a first region 18a, and the second layer 18b is hereinafter called a second region 18b.

Both ends of the hole stopper layer 19 reach the front surface 10a of the semiconductor substrate 10 so that the first region 18a and the second region 18b can be completely separated from each other by the hole stopper layer 19. It is noted that the hole stopper layer 19 is indicated by a heavy line in FIG. 24.

Like the preceding embodiments, the hole stopper layer 19 is formed in the channel region 13 at a shallow depth. It is preferable that the peak depth of the hole stopper layer 19 be equal to or less than fifty percent of the depth of the channel region 13 from the front surface 10a of the semiconductor substrate 10. It is more preferable that the peak depth of the hole stopper layer 19 be equal to or less than twenty percent of the depth of the channel region 13 from the front surface 10a of the semiconductor substrate 10. In such an approach, even in the case of a planer gate IGBT element, the switching loss can be effectively reduced.

The gate insulating layer 16 is formed on the front surface 10a of the semiconductor substrate 10. A contact hole 16a is formed in the gate insulating layer 16 so that a part of the emitter region 14, the body region 15, and the first region 18a can be exposed outside the gate insulating layer 16 through the contact hole 16a. The gate electrode 17 is formed on the gate insulating layer 16 and covered with the gate insulating layer 16. The emitter electrode 21 (not shown) is formed on the gate insulating layer 16 and electrically connected to the emitter region 14, the body region 15, and the first region 18a through the contact hole 16a.

The N-type field stop layer 22, the P+-type collector layer 23, and the collector electrode 24 are formed in the mentioned order on the back surface 10b side of the semiconductor substrate 10.

As can be seen from FIG. 24, a region from the center of the channel region 13 to the center of the floating region 18 adjacent to the channel region 13 in a direction in which the channel region 13 and the floating region 18 are alternately arranged defines a unit cell. The unit cells are repeatedly arranged.

As described above, in the case of a planar gate IGBT element, the hole stopper layer 19 can be formed in the floating region 18.

(Fourteenth Embodiment)

Figure 25:
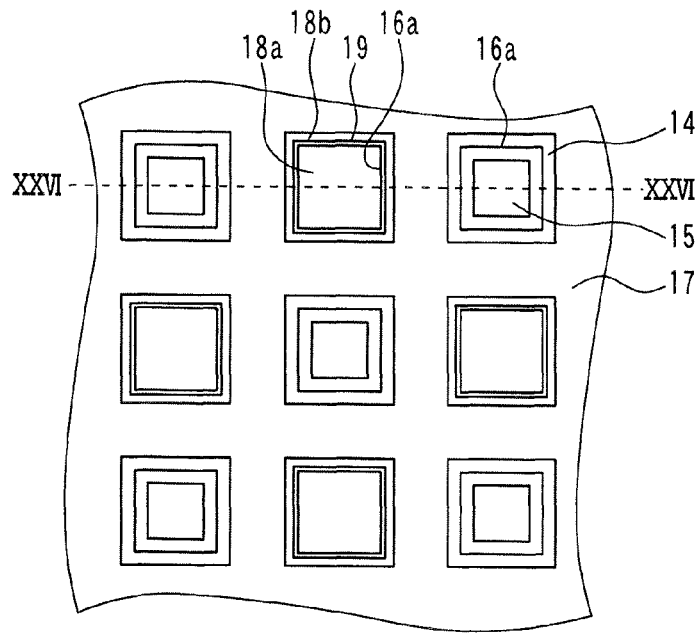
FIG. 25 is a diagram illustrating a plan view of an IGBT element according to a fourteenth embodiment of the present invention.
Figure 26:
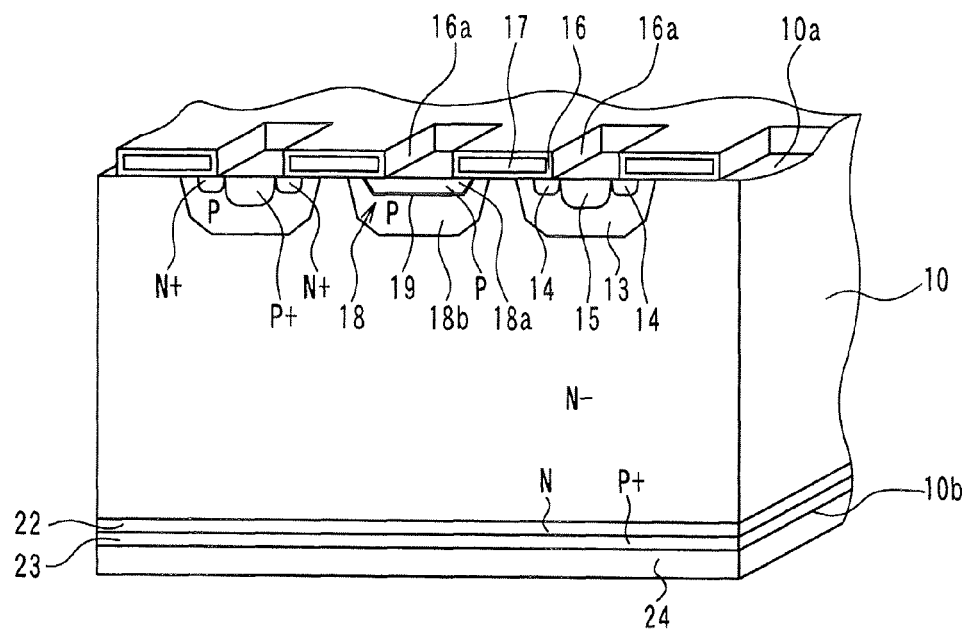
FIG. 26 is a diagram illustrating a cross-sectional view taken along the line XXVI-XXVI in FIG. 25.

A fourteenth embodiment of the present invention is described below with reference to FIGS. 25 and 26. FIG. 25 is a plan view of an IGBT element according to the fourteenth embodiment. FIG. 26 is a cross-sectional view taken along the line XXVI-XXVI. As shown in FIG. 25, the channel region 13 and the floating region 18 are arranged in a zigzag pattern in a direction parallel to the front surface 10a of the semiconductor substrate 10. Specifically, the channel region 13 and the floating region 18 are alternately arranged in both row and column directions and aligned in both row and column directions. Accordingly, as shown in FIG. 26, rectangular contact holes 16a are formed in the gate insulating layer 16 and arranged in a zigzag pattern.

As described above, in the case of a planar gate IGBT element, the channel region 13 and the floating region 18 can be arranged in a zigzag pattern.

(Fifteenth Embodiment)

Figure 27:
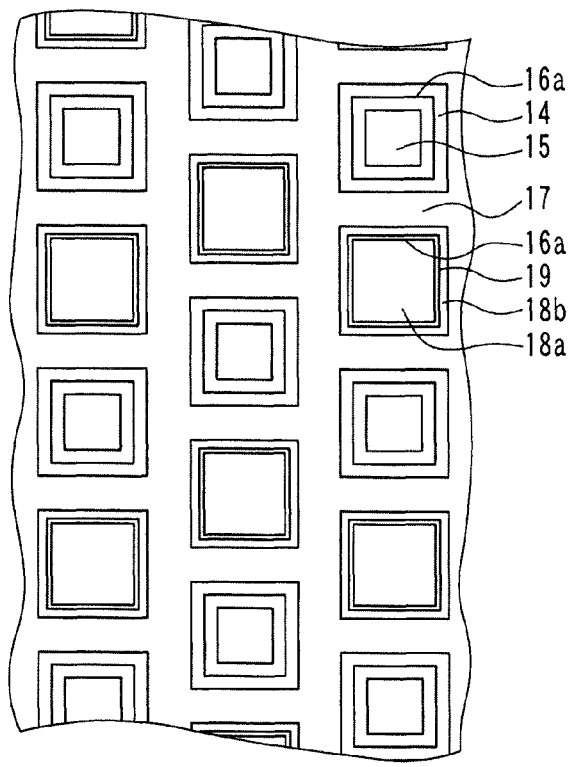
FIG. 27 is a diagram illustrating a plan view of an IGBT element according to a fifteenth embodiment of the present invention.

A fifteenth embodiment of the present invention is described below with reference to FIG. 27. FIG. 27 is a plan view of an IGBT element according to the fifteenth embodiment. Like the fourteenth embodiment, the channel region 13 and the floating region 18 are arranged in a zigzag pattern. As can be seen by comparing FIGS. 25 and 27, the fifteenth embodiment differs from the fourteenth embodiment in that the channel region 13 and the floating region 18 are misaligned in a row (or column) direction.

(Sixteenth Embodiment)

Figure 28:
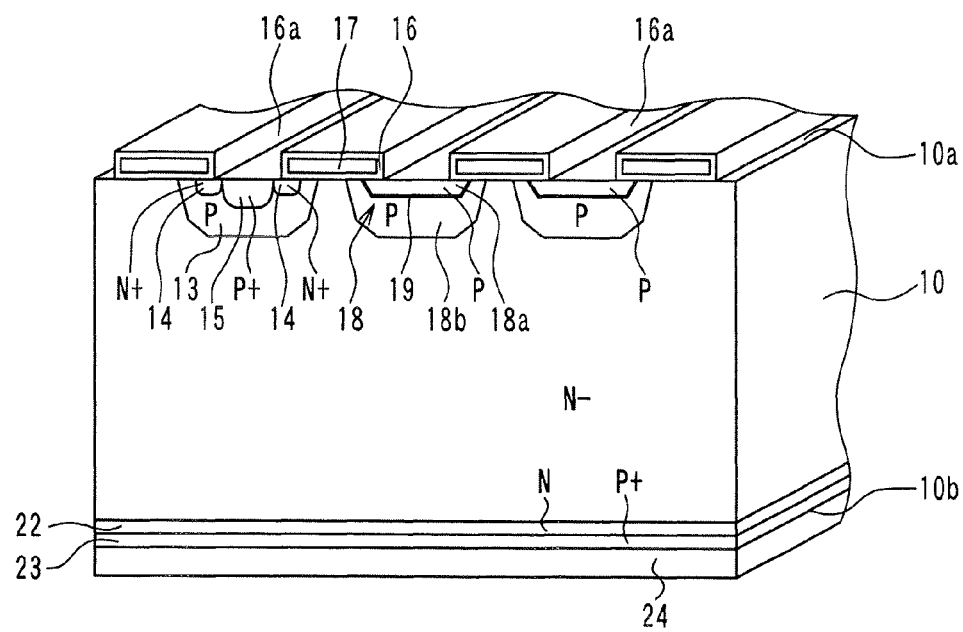
FIG. 28 is a diagram illustrating a perspective cross-sectional view of an IGBT element according to a sixteenth embodiment of the present invention.

A sixteenth embodiment of the present invention is described below with reference to FIG. 28. FIG. 28 is a perspective cross-sectional view of an IGBT element according to the sixteenth embodiment. As shown in FIG. 28, according to the sixteenth embodiment, one channel region 13 is paired with two floating regions 18 to form a unit cell. The channel region 13 and the floating region 18 extend in a direction parallel to the front surface 10a of the semiconductor substrate 10 and are arranged in a stripe pattern. In this way, the number of floating regions 18 between adjacent channel regions 13 can be increased so that the interval between adjacent channel regions 13 can be increased.

(Seventeenth Embodiment)

Figure 29:
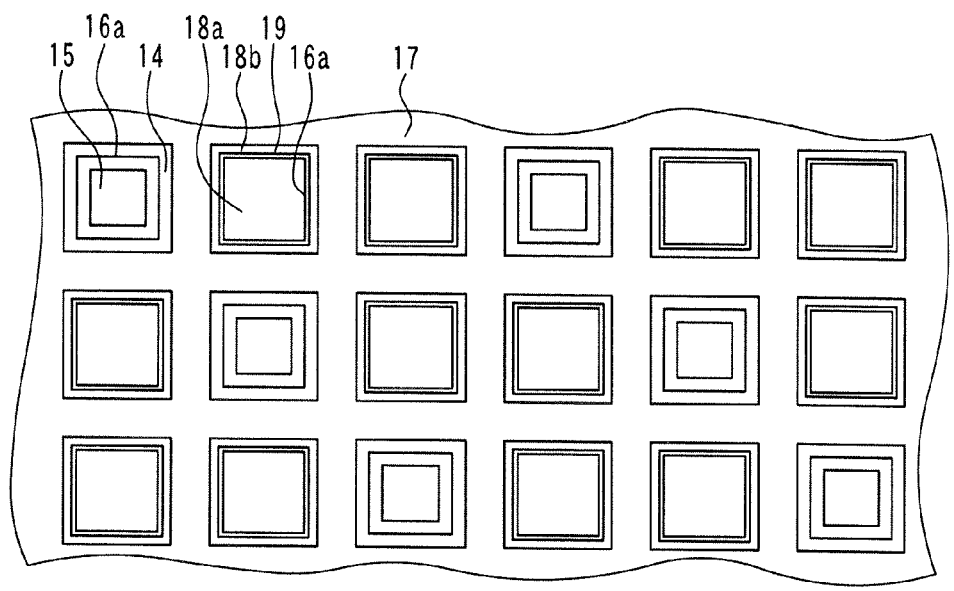
FIG. 29 is a diagram illustrating a plan view of an IGBT element according to a seventeenth embodiment of the present invention.

A seventeenth embodiment of the present invention is described below with reference to FIG. 29. FIG. 29 is a perspective cross-sectional view of an IGBT element according to the seventeenth embodiment. As can be seen from FIG. 29, the seventeenth embodiment corresponds to a combination of the fourteenth embodiment and the sixteenth embodiment. In this way, the channel region 13 and the floating region 18 can be arranged in a zigzag pattern while increasing the number of floating regions 18 between adjacent channel regions 13.

(Eighteenth Embodiment)

Figure 30:
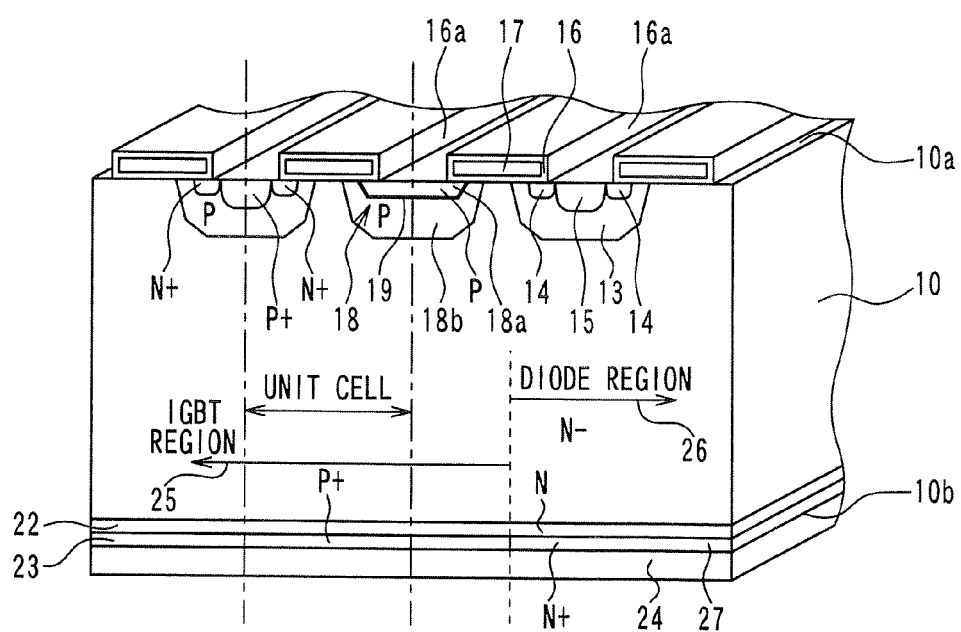
FIG. 30 is a diagram illustrating a perspective cross-sectional view of an IGBT element according to an eighteenth embodiment of the present invention.

An eighteenth embodiment of the present invention is described below with reference to FIG. 30. The thirteenth to seventeenth embodiment are based on a planar gate IGBT. In contrast, the eighteenth embodiment is based on a planar gate RC-IGBT. As shown in FIG. 30, on the back surface 10b side of the semiconductor substrate 10, the P+-type collector layer 23 is formed in the IGBT region 25, and the N+-type cathode layer 27 is formed in the diode region 26.

For example, as shown in FIG. 18, the IGBT region 25 and the diode region 26 are alternately arranged in a strip pattern.

(Nineteenth Embodiment)

Figure 31:
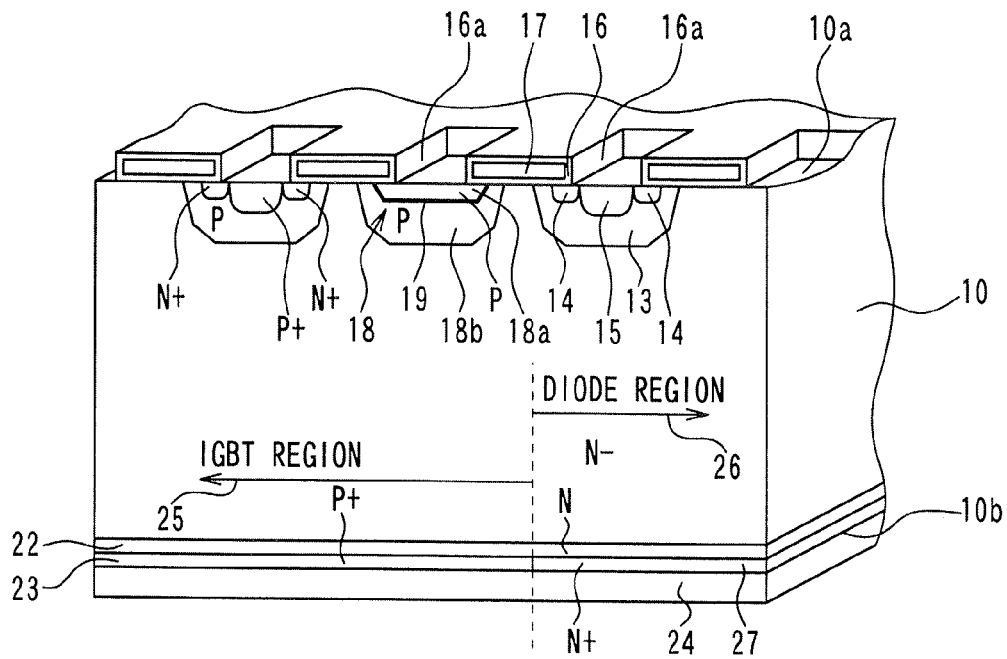
FIG. 31 is a diagram illustrating a perspective cross-sectional view of an IGBT element according to a nineteenth embodiment of the present invention.

A nineteenth embodiment of the present invention is described below with reference to FIG. 31. The nineteenth embodiment differs from the eighteenth embodiment in the following point. In the eighteenth embodiment, the channel region 13 and the floating region 18 are alternately arranged in a strip pattern. In the nineteenth embodiment, like the fourteenth embodiment, the channel region 13 and the floating region 18 are arranged in a zigzag pattern.

(Twentieth Embodiment)

Figure 32:
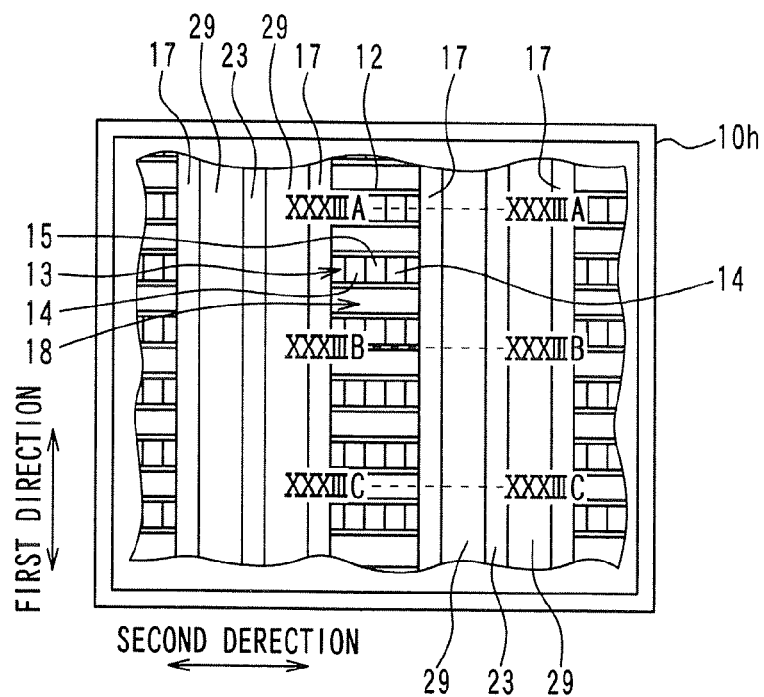
FIG. 32 is a diagram illustrating a plan view of an IGBT element according to a twentieth embodiment of the present invention.
Figure 33A:
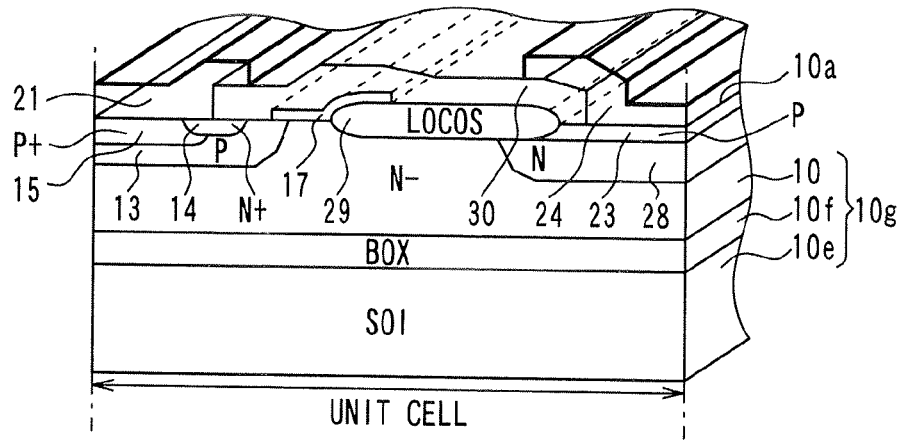
FIG. 33A is a diagram illustrating a cross-sectional view taken along the line XXXIIIA-XXXIIIA in FIG. 32.

A twentieth embodiment of the present invention is described below with reference to FIG. 32 and FIGS. 33A-33C. FIG. 32 is a plan view of a lateral IGBT according to the twentieth embodiment. FIG. 33A is a cross-sectional view taken along the line XXXIIIA-XXXIIIA in FIG. 32, FIG. 33B is a cross-sectional view taken along the line XXXIIIB-XXXIIIB in FIG. 32, and FIG. 33C is a cross-sectional view taken along the line XXXIIIC-XXXIIIC in FIG. 32.

Figure 33B:
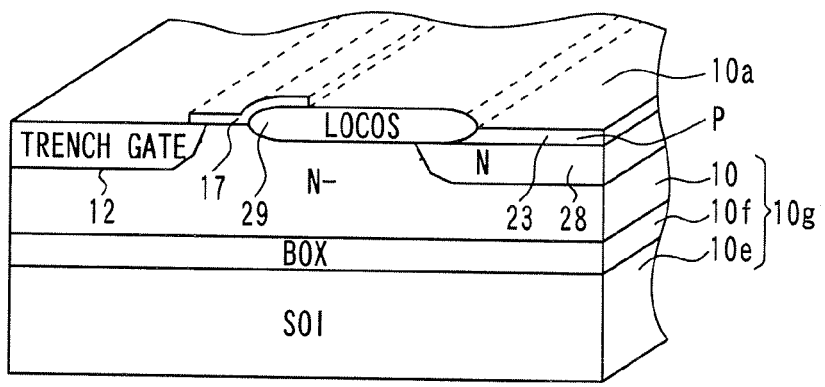
FIG. 33B is a diagram illustrating a cross-sectional view taken along the line XXXIIIB-XXXIIIB in FIG. 32.
Figure 33C:
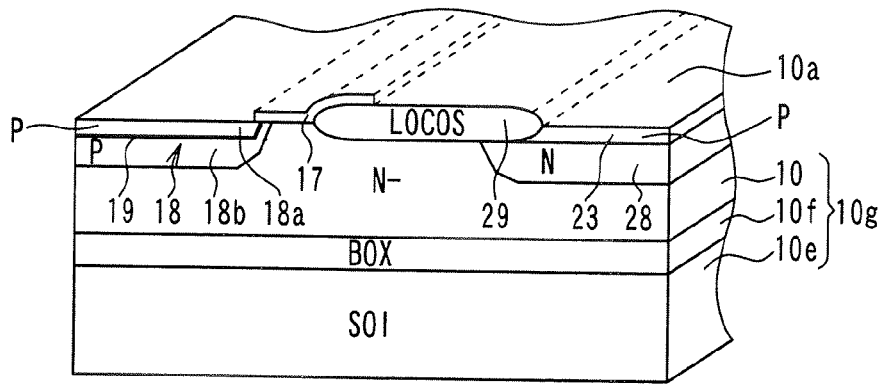
FIG. 33C is a diagram illustrating a cross-sectional view taken along the line XXXIIIC-XXXIIIC in FIG. 32.

As shown in FIGS. 33A-33C, an insulating layer (BOX: buried oxide layer) 10*f* is formed on a supporting substrate 10*e*, and an N⁻-type semiconductor layer is formed on the insulating layer 10*f* so that a SOI substrate 10*g* can be formed. The N⁻-type semiconductor layer on the insulating layer 10*f* corresponds to the semiconductor substrate 10 in the preceding embodiments. Therefore, the N⁻-type semiconductor layer on the insulating layer 10*f* is sometimes hereinafter called the "semiconductor layer 10".

As shown in FIG. 32, a rectangular ring shaped trench 10*h* is formed in the semiconductor layer 10. The trench 10*h* reaches the insulating layer 10*f*. Although not shown in the drawings, the trench 10*h* is filed with an insulating material. A lateral IGBT is formed in an area surround by the trench 10*h*.

Specifically, as shown in FIGS. 33A-33C, the P-type collector layer 23 is formed in a surface portion of an N-type buffer region 28 that is formed in a surface portion of the semiconductor layer 10. As shown in FIG. 32, the collector layer 23 extends in a first direction parallel to the front surface 10*a* of the semiconductor layer 10. A LOCOS oxide layer 29 is formed in a surface portion of the semiconductor layer 10. The LOCOS oxide layer 29 is located on both sides of the collector layer 23 and extends along the collector layer 23.

Further, as shown in FIG. 32, a P-type region is formed between adjacent LOCOS oxide layers 29 and extends along the first direction. The P-type region between adjacent LOCOS oxide layers 29 is divided into the channel region 13 and the floating region 18 by the trenches 12 that extend in a second direction perpendicular to the first direction. The channel region 13 and the floating region 18 are alternately arranged in the first direction. The N⁺-type emitter regions 14 are formed in the channel region 13 and spaced from each other in the second direction. The P⁺-type body region 15 is formed between the emitter regions 14.

The gate insulation layer 16 and the gate electrode 17 are buried in each trench 12 so that a trench gate structure can be formed. For sake of simplicity, the gate insulating layer 16 and the gate electrode 17 in the trench 12 are omitted in FIG. 32 and FIGS. 33A-33C.

As shown in FIG. 33C, the N-type hole stopper layer 19 is formed in the floating region 18 to divide the floating region 18 into the first region 18*a* and the second region 18*b*. The first region 18*a* is located on the first surface 10*a* side of the semiconductor layer 10 with respect to the N-type hole stopper layer 19, and the second region 18*b* is located on the supporting substrate 10*e* side with respect to the N-type hole stopper layer 19. Both ends of the hole stopper layer 19 reach the front surface 10*a* of the semiconductor layer 10 so that the first region 18*a* and the second region 18*b* can be completely separated from each other by the hole stopper layer 19. It is noted that the hole stopper layer 19 is indicated by a heavy line in FIG. 33C.

Further, as shown in FIG. 32, the gate electrode 17 made of polysilicon is formed on the front surface 10*a* of the semiconductor layer 10. The gate electrode 17 extends along the LOCOS oxide layer 29. The gate electrode 17 is located between the LOCOS oxide layer 29 and the P-type region where the channel region 13 and the floating region 18 are formed. A first end of the gate electrode 17 is located on the LOCOS oxide layer 29, and a second end of the gate electrode 17 is located in the trench 12.

In FIGS. 33A-33C, a part of the gate electrode 17 is directly formed on the front surface 10*a* of the semiconductor layer 10. However, in practice, the part of the gate electrode 17 is formed on the gate insulation layer 16 (not shown) that is located on the front surface 10*a* of the semiconductor layer 10.

As can be seen from FIG. 33A, a region from the body region 15 to the collector layer 23 defines a unit cell. As shown in FIG. 32, the unit cells are repeatedly arranged. The LOCOS oxide layer 29 is covered with an insulating layer 30 in such a manner that a part of the emitter region 14, the body region 15, and a part of the collector layer 23 can be exposed outside the insulating layer 30. The emitter electrode 21 is formed on the exposed emitter region 14 and the body region 15. The collector electrode 23 is formed on the exposed collector layer 23.

For sake of simplicity, the insulating layer 30, the emitter electrode 21, and the collector electrode 24 are omitted in FIGS. 33B and 33C. The first layer 18*a* is connected to the emitter electrode 21 that is grounded.

As described above, in the case of a lateral trench gate IGBT element, the hole stopper layer 19 can be formed in the floating region 18.

(Twenty-first Embodiment)

Figure 34A:
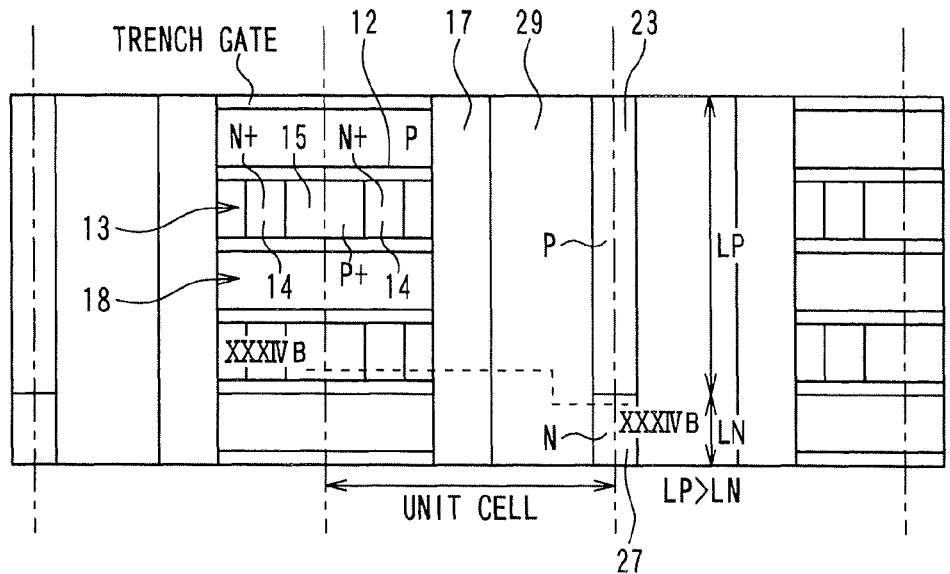
FIG. 34A is a diagram illustrating a partial plan view of an IGBT element according to a twenty-first embodiment of the present invention.
Figure 34B:
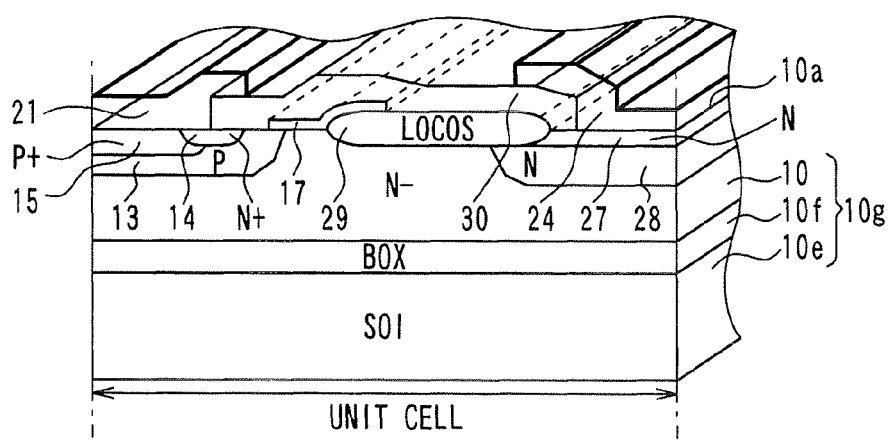
FIG. 34B is a diagram illustrating a cross-sectional view taken along the line XXXIVB-XXXIVB in FIG. 34A.

A twenty-first embodiment of the present invention is described below with reference to FIGS. 34A and 34B. FIG. 34A is a plan view of an IGBT according to the twenty-first embodiment. FIG. 34B is a cross-sectional view taken along the line XXXIVB-XXXIVB in FIG. 34A.

As shown in FIG. 34A, according to the twenty-first embodiment, the P-type collector layer 23 is partially replaced with the N-type cathode layer 27 so that a lateral RC-IGBT can be formed. An area from the channel region 13 to the collector layer 23 passing the semiconductor layer 10 and the buffer region 28 serves as an IGBT. On the other hand, an area from the channel region 13 to the cathode layer 27 passing the semiconductor layer 10 and the buffer region 28 serves as a diode.

As shown in FIG. 34B, the N-type cathode layer 27 is formed in a surface portion of the buffer region 28. It is noted that cross-sections in the trench 12 and the floating region 18 are the same as shown in FIGS. 33B and 33C.

In FIG. 34, LP represents a length of the collector layer 23 in the first direction parallel to the front surface 10*a* of the semiconductor layer 10, and LN represents a length of the cathode layer 27 in the first direction. It is preferable that the length LP of the collector layer 23 be greater than the length LN of the cathode layer 27. In such an approach, the on-voltage of the IGBT can be reduced as compared to when the length LP of the collector layer 23 is equal to the length LN of the cathode layer 27.

(Modifications)

The embodiments described above can be modified in various ways, for example, as follows.

In the embodiments, the trench 12 has a ring shape, the base layer 11 located between adjacent trenches 12 provides the channel layer 13, and the base layer 12 enclosed with the trench 12 provides the floating layer 18. This is one example of a layout of the trench 12. The trench 12 can have a different layout.

The structure of the trench gate RC-IGBT on the border between the IGBT region 25 and the diode region 26 of the second through sixth embodiments can be applied to the planer gate RC-IGBT of the eighteenth and nineteenth embodiments.

Figure 35A:
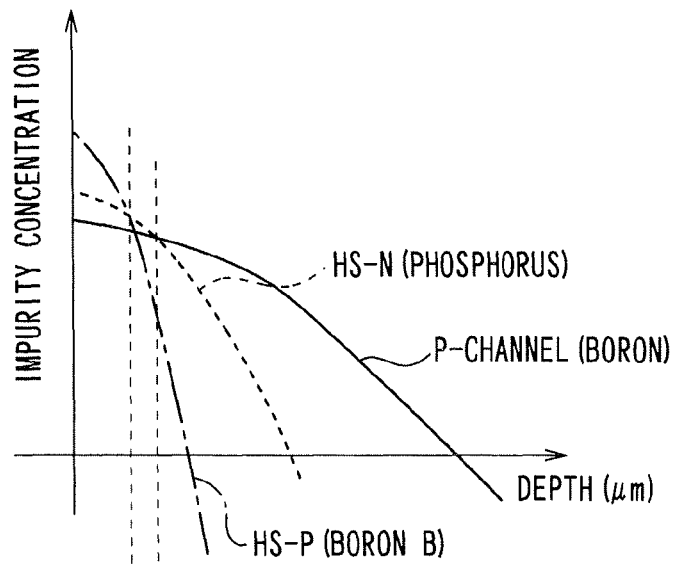
FIGS. 35A and 35B are diagrams for explaining a modification of the embodiments.
Figure 35B:
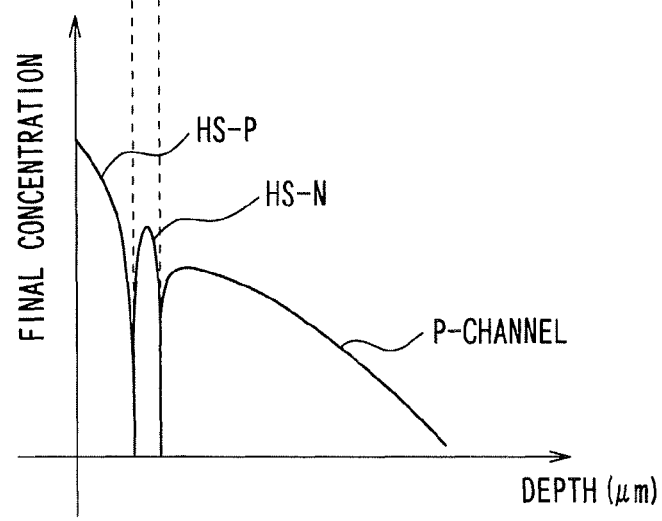

In the embodiments, the hole stopper layer 19 is formed by ion implantation. Alternatively, the hole stopper layer 19 can be formed by thermal diffusion. In this case, as shown in FIG. 35A, the floating layer 18 (P-channel) is inverted by phosphorus (HS-N), and then the phosphorus (HS-N) is inverted by boron (HS-P). Therefore, as shown in FIG. 35B, a final concentration variation may become large. To prevent this, when the hole stopper layer 19 is formed by ion implantation, a suitable phosphorus layer (HS-N) as the hole stopper layer 19 can be formed by adding a specific boron layer (HS-P) instead of the body region 15. It is noted that the vertical axis in each of FIGS. 35A and 35B is logarithmic.

Figure 36A:
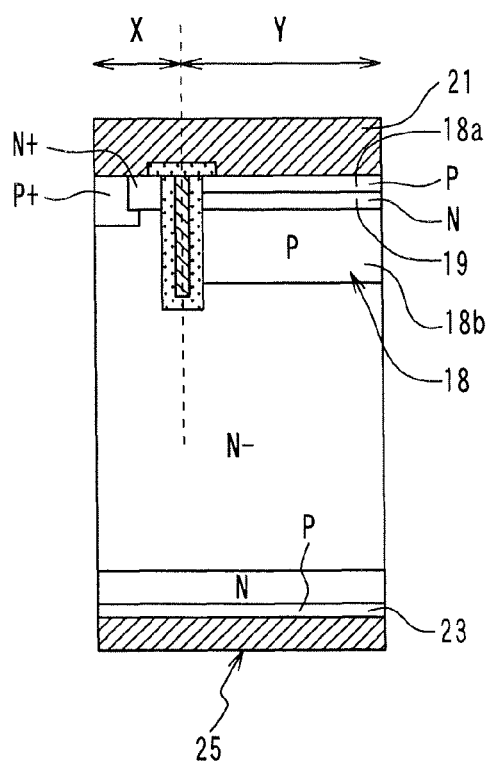
FIG. 36A is a diagram illustrating a cross-sectional view of a unit structure of an IGBT element according to another modification of the embodiments.
Figure 36B:
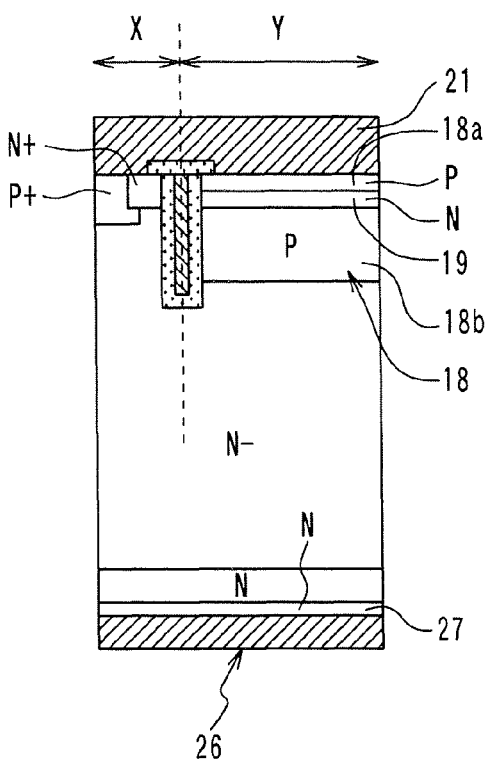
FIG. 36B is a diagram illustrating a cross-sectional view of a unit structure of a diode element of a RC-IGBT element according to another modification of the embodiments.

In the embodiments, the $N^+$-type emitter region 14 and the $P^+$-type body region 15 are formed in the channel layer 13 or the channel region 13. Alternatively, as shown in FIG. 36A, the $N^+$-type emitter region 14 and the $P^+$-type body region 15 can be formed directly on the front surface 10a side of the semiconductor substrate 10 to form a channel-less structure. In the case of a RC-IGBT, as shown in FIG. 36B, the N-type cathode layer 27 can be formed on the back surface 10b side of the semiconductor substrate 10. The channel-less structure reduces a channel resistance so that an on-voltage can be reduced effectively. Even in the channel-less structure, the intervals X, Y of the trenches 12 can be adjusted as needed.

Such changes and modifications are to be understood as being within the scope of the present invention as defined by the appended claims.

What is claimed is:

1. An insulated gate semiconductor device having an IGBT element comprising:
 a first conductivity type semiconductor substrate having a first surface;
 a plurality of second conductivity type channel regions on the first surface side of the substrate;
 a plurality of second conductivity type floating regions on the first surface side of the substrate, each floating region having a predetermined depth from the first surface of the semiconductor substrate;
 a first conductivity type emitter region in a surface portion of each channel region;
 a second conductivity type body region in the surface portion of each channel region, the body region being deeper than the emitter region;
 a first conductivity type hole stopper layer in each floating region to divide the floating region into a first region and a second region in a direction of the depth of the floating region, the first region located on the first surface side of the substrate, the second region located on a bottom side of the floating region; and
 an emitter electrode located on the first surface of the substrate and electrically connected to each of the emitter region and the first region, wherein
 the plurality of channel regions and the plurality of floating regions are repeatedly arranged in a predetermined pattern in a direction parallel to the first surface of the substrate in such a manner that at least one floating region is located between adjacent channel regions, and
 a peak depth of the hole stopper layer from the first surface of the substrate is equal to or less than fifty percent of the depth of the floating region.

2. The insulated gate semiconductor device according to claim 1, wherein
 a peak depth of the hole stopper layer from the first surface of the substrate is equal to or less than twenty percent of the depth of the floating region.

3. The insulated gate semiconductor device according to claim 1, further comprising:
 a second conductivity type base layer on the first surface side of the substrate;
 a plurality of trenches on the first surface side of the substrate and dividing the base layer into the plurality of channel regions and the plurality of floating regions;
 a gate insulating layer on an inner surface of each trench;
 a gate electrode on the gate insulating layer;
 a second conductive type collector layer on a second surface side of the substrate, the second surface being opposite to the first surface; and
 a collector electrode on the collector layer, wherein
 the IGBT element is configured as a vertical trench gate IGBT.

4. The insulated gate semiconductor device according to claim 3, wherein
 a first interval of adjacent trenches between which each channel region is located is less than a second interval of adjacent trenches between which each floating region is located.

5. The insulated gate semiconductor device according to claim 3, wherein
 a first interval of adjacent trenches between which each channel region is located is equal to or less than a second interval of adjacent trenches between which each floating region is located.

6. The insulated gate semiconductor device according to claim 3, further comprising:
 a first conductivity type cathode layer on the second surface side of the substrate, wherein
 a region corresponding to the collector layer defines an IGBT region serving as the IGBT element, and
 a region corresponding to the cathode layer defines a diode region serving as a diode element.

7. The insulated gate semiconductor device according to claim 6, wherein
 the plurality of channel regions and the plurality of floating regions are repeatedly arranged in each of the IGBT region and the diode region.

8. The insulated gate semiconductor device according to claim 6, wherein
 the plurality of channel regions and the plurality of floating regions are repeatedly arranged in the IGBT region, and
 the base layer in the diode region has only the hole stopper layer so as to serve as the floating region.

9. The insulated gate semiconductor device according to claim 8, wherein
 the base layer on the border between the IGBT region and the diode region in a depth direction of each trench has the emitter region so as to serve as the channel region.

10. The insulated gate semiconductor device according to claim 1, further comprising:
 a gate insulating layer on the first surface of the substrate at a position corresponding to each channel region;
 a gate electrode on the gate insulating layer;
 a second conductive type collector layer on a second surface side of the substrate, the second surface being opposite to the first surface; and
 a collector electrode on the collector layer, wherein
 the IGBT element is configured as a vertical planar gate IGBT.

11. The insulated gate semiconductor device according to claim 1, wherein
 the hole stopper layer is not located in any of the plurality of channel regions.

12. The insulated gate semiconductor device according to claim 1, wherein
 the hole stopper layer comprises a plurality of stopper layers each located only in a corresponding floating region.

13. An insulated gate semiconductor device having an IGBT element comprising:
- a first conductivity type semiconductor substrate, having a first surface;
- a plurality of second conductivity type channel regions on the first surface side of the substrate;
- a plurality of second conductivity type floating regions on the first surface side of the substrate, each floating region having a predetermined depth from the first surface of the semiconductor substrate;
- a first conductivity type emitter region in a surface portion of each channel region;
- a second conductivity type body region in the surface portion of each channel region, the body region being deeper than the emitter region;
- a first conductivity type hole stopper layer in each floating region to divide the floating region into a first region and a second region in a direction of the depth of the floating region, the first region located on the first surface side of the substrate, the second region located on a bottom side of the floating region;
- an emitter electrode located on the first surface of the substrate and electrical connected to each of the emitter region and the first region;
- second conductivity type base layer on the first surface of the substrate;
- a plurality of trenches on the first surface side of the substrate and dividing the base layer into the plurality of channel regions and the plurality of floating regions;
- a gate insulating layer on an inner surface of each trench;
- a gate electrode on the gate insulating layer;
- a second conductive type collector layer on a second surface side of the substrate, the second surface being opposite to the first surface;
- a collector electrode on the collector layer; and
- a first conductivity type cathode layer on the second surface side of the substrate, wherein:
- the plurality of channel regions and the plurality of floating regions are repeatedly arranged in a predetermined pattern in a direction parallel to the first surface of the substrate in such a manner that at least one floating region is located between adjacent channel regions,
- the IGBT element is configured as a vertical trench gate IGBT,
- a region corresponding to the collector layer defines an IGBT region serving as the IGBT element,
- a region corresponding to the cathode layer defines a diode region serving as a diode element,
- the plurality of channel regions and the plurality of floating regions are repeatedly arranged in the IGBT region, and
- the base layer in the diode region has no emitter region and no hole stopper layer.

14. The insulated gate semiconductor device, according to claim 13, wherein
- the base layer on the border between the IGBT region and the diode region in a depth direction of each trench has the emitter region so as to serve as the channel region.

15. An insulated gate semiconductor device having an IGBT element, comprising:
- first conductivity type semiconductor substrate having a first surface;
- a plurality of second conductivity type channel regions on the first surface side of the substrate;
- a plurality of second conductivity type floating regions on the first surface side of the substrate, each floating region having a predetermined depth from the first surface of the semiconductor substrate;
- a first conductivity type emitter region in a surface portion of each channel region;
- a second conductivity type body region in the surface portion of each channel region, the body region being deeper than the emitter region;
- a first conductivity type hole stopper layer in each floating region to divide the floating region into a first region and a second region in a direction of the depth of the floating region, the first region located on the first surface side of the substrate, the second region located on a bottom side of the floating region;
- an emitter electrode located on the first surface of the substrate and electrically connected to each of the emitter region and the first region,
- a second conductivity type base layer on the first surface side of the substrate and extending in a first direction parallel to the first surface of the semiconductor substrate;
- a plurality of trenches on the first surface side of the substrate and extending in a second direction perpendicular to the first direction, the plurality of trenches dividing the base region into the plurality of channel regions and the plurality of floating regions;
- a gate insulating layer on an inner surface of each trench;
- a gate electrode on the gate insulating layer;
- a first conductivity type buffer region on the first surface side of the semiconductor substrate, the buffer region spaced from the base layer and extending along the base layer;
- a second conductive type collector layer in a surface portion of the buffer region; and
- a collector electrode on the collector layer, wherein:
- the plurality of channel regions and the plurality of floating regions are repeatedly arranged in a predetermined pattern in a direction parallel to the first surface of the substrate in such a manner that at least one floating region is located between adjacent channel regions, and
- the IGBT element is configured as a lateral trench gate IGBT.

16. The insulated gate semiconductor device according to claim 15 further comprising:
- a first conductivity type cathode layer partially replacing the collector layer.

17. The insulated gate semiconductor device according to claim 16, wherein
- a length of the collector layer is greater than a length of the cathode layer in the first direction.

* * * * *